United States Patent
Oshita et al.

(10) Patent No.: US 12,109,665 B2
(45) Date of Patent: Oct. 8, 2024

(54) MODIFICATION METHOD OF POLYURETHANE, POLYURETHANE, POLISHING PAD, AND MODIFICATION METHOD OF POLISHING PAD

(71) Applicant: KURARAY CO., LTD., Kurashiki (JP)

(72) Inventors: Azusa Oshita, Kurashiki (JP); Mitsuru Kato, Kurashiki (JP); Minori Takegoshi, Kurashiki (JP); Chihiro Okamoto, Kurashiki (JP); Shinya Kato, Chiyoda-ku (JP)

(73) Assignee: KURARAY CO., LTD., Kurashiki (JP)

( * ) Notice: Subject to any disclaimer, the term of this patent is extended or adjusted under 35 U.S.C. 154(b) by 831 days.

(21) Appl. No.: 17/054,049

(22) PCT Filed: Apr. 26, 2019

(86) PCT No.: PCT/JP2019/018022
§ 371 (c)(1),
(2) Date: Nov. 9, 2020

(87) PCT Pub. No.: WO2019/216279
PCT Pub. Date: Nov. 14, 2019

(65) Prior Publication Data
US 2021/0276143 A1 Sep. 9, 2021

(30) Foreign Application Priority Data
May 11, 2018 (JP) .................................. 2018-092608

(51) Int. Cl.
*H01L 51/00* (2006.01)
*B24B 37/24* (2012.01)
(Continued)

(52) U.S. Cl.
CPC ............ *B24B 37/24* (2013.01); *C08G 18/692* (2013.01); *C08G 18/83* (2013.01); *H01L 21/30625* (2013.01)

(58) Field of Classification Search
None
See application file for complete search history.

(56) References Cited

U.S. PATENT DOCUMENTS

| 4,513,125 A | 4/1985 | Holubka |
| 4,515,926 A | 5/1985 | Holubka |

(Continued)

FOREIGN PATENT DOCUMENTS

| CN | 101232970 A | 7/2008 | |
| CN | 105176063 A * | 12/2015 | .............. C08L 75/06 |

(Continued)

OTHER PUBLICATIONS

Feng, Libang, et al. "Self-healing behavior of polyurethanes based on dual actions of thermo-reversible Diels-Alder reaction and thermal movement of molecular chains." Polymer 124 (2017): 48-59. (Year: 2017).*

(Continued)

*Primary Examiner* — Robert S Loewe
(74) *Attorney, Agent, or Firm* — Oblon, McClelland, Maier & Neustadt, L.L.P.

(57) ABSTRACT

A modification method of a polyurethane, including the steps of: preparing a polyurethane having an ethylenically unsaturated bond; and treating the polyurethane with a liquid containing a compound having a conjugated double bond, or a modification method of a polyurethane, including the steps of: preparing a polyurethane having a conjugated double bond; and treating the polyurethane with a liquid containing a compound having an ethylenically unsaturated bond is used.

18 Claims, 9 Drawing Sheets

(51) Int. Cl.
  *C08G 18/69* (2006.01)
  *C08G 18/83* (2006.01)
  *H01L 21/306* (2006.01)

(56) References Cited

U.S. PATENT DOCUMENTS

| | | |
|---|---|---|
| 5,182,355 A | 1/1993 | Martz et al. |
| 2009/0191795 A1 | 7/2009 | Kuwabara et al. |
| 2010/0009612 A1 | 1/2010 | Park et al. |
| 2012/0082840 A1* | 4/2012 | Herr .................. C09J 133/16 427/398.1 |
| 2014/0323001 A1 | 10/2014 | Schmidt et al. |
| 2017/0226271 A1* | 8/2017 | Makal .................. C08L 75/04 |

FOREIGN PATENT DOCUMENTS

| | | |
|---|---|---|
| CN | 110573547 A | 12/2019 |
| EP | 3 150 648 A1 | 4/2017 |
| JP | 57-21 470 A | 2/1982 |
| JP | 59-136318 A | 8/1984 |
| JP | 7-2823 A | 1/1995 |
| JP | 2003-183348 A | 7/2003 |
| JP | 2005-294661 A | 10/2005 |
| JP | 2011-213866 A | 10/2011 |
| JP | 2013-18056 A | 1/2013 |
| JP | 2014-533772 A | 12/2014 |
| JP | 2019-94380 A | 6/2019 |
| WO | WO 2008/029725 A1 | 3/2008 |
| WO | WO 2018/021428 A1 | 2/2018 |

OTHER PUBLICATIONS

Laita, H., S. Boufi, and A. Gandini. "The application of the Diels-Alder reaction to polymers bearing furan moieties. 1. Reactions with maleimides." European Polymer Journal 33.8 (1997): 1203-1211. (Year: 1997).*
Pyo, Kyoung-hee et al. "Extremely rapid and simple healing of a transparent conductor based on Ag nanowires and polyurethane with a Diels-Alder network." Journal of Materials Chemistry C 4.5 (2016): 972-977. (Year: 2016).*
Machine translation of CN-105176063-A, translation generated Jan. 2024, 22 pages. (Year: 2024).*
Okhay, Nidhal, et al. "Diels-Alder thermoresponsive networks based on high maleimide-functionalized urethane prepolymers." Designed Monomers and Polymers 16.5 (2013): 475-487. (Year: 2013).*
Aguilar-Castro, C. et al., "Biobased polyester obtained from bifunctional monomers through metathesis of fatty acids as precursor to synthesis of polyurethanes," Journal of Applied Polymer Science, vol. 136, Issue8, Oct. 2018, pp. 1-12.
International Search Report issued on Jul. 23, 2019 in PCT/JP2019/018022 Apr. 26, 2019, 2 pages.
Partial Supplementary European Search Report issued Jan. 4, 2022 in corresponding European Patent Application No. 19798967.6, 20 pages.
B. Willocq et al., "One-component Diels-Alder based polyurethanes: a unique way to self-heal", RSC Advances, vol. 7, No. 76, XP055873750, Oct. 12, 2017, pp. 48047-48053 Retrieved from the Internet: URL:https://pubs.rsc.org/en/content/articlepdf/2017/ra/c7ra09898g.

* cited by examiner

Dissociation condition

MODIFICATION METHOD OF POLYURETHANE, POLYURETHANE, POLISHING PAD, AND MODIFICATION METHOD OF POLISHING PAD

TECHNICAL FIELD

The present invention relates to a modification method of a polyurethane, a novel polyurethane, and a polishing pad.

BACKGROUND ART

Chemical mechanical polishing (CMP) is known as a polishing method used in steps of mirror-finishing a semiconductor wafer, and planarizing the surface of an object to be polished including an insulating film such as an oxide film and a conductor film in order to form a circuit on a semiconductor substrate. CMP is a method in which an object to be polished is polished with high precision by using a polishing pad, while supplying a slurry containing abrasive grains and a reaction liquid onto the surface of the object to be polished. Polyurethanes are preferably used as the materials of the polishing pads used for CMP.

With the recent increase in the level of integration and the number of multilayered interconnections of circuits formed on a semiconductor substrate, there is a need for an increased polishing rate and an improvement for even higher flatness for CMP. To meet such a need, there has been proposed an improvement of the surface properties, such as a technique for adjusting the zeta potential of the surface of a polyurethane in order to increase the polishing rate by increasing the affinity between the abrasive grains contained in the slurry and the polishing surface of the polishing pad. For example, PTL 1 listed below discloses a polishing pad that can reduce the time required for a preparation step (break-in (start-up)) of roughening the surface of the polishing pad by a dressing treatment in the initial usage stage in which the polishing pad is attached to a polishing device and the polishing device is started. PTL 1 discloses a polishing pad including a polishing surface pressed onto an object to be polished, wherein corrugations on the polishing surface have a cycle in the range of 5 mm to 200 mm, and a maximum amplitude of 40 μm or less. PTL 1 also discloses that when the zeta potential of the polishing surface is −50 mV or more and less than 0 mv, repulsion against negatively charged abrasive grains contained in the slurry for the polishing surface is suppressed, and an affinity between the polishing surface and the abrasive grains thus becomes better, as a result of which the break-in time can be reduced.

PTL 2 listed below discloses a polishing pad that inhibits the adhesion of polishing debris to a polishing surface so as to reduce the occurrence of scratches and defects on the surface of an object to be polished, thus increasing the product yield, and achieving high planarization performance and an adequate polishing rate. PTL 2 discloses a polishing pad wherein a zeta potential of a polishing surface opposing the object to be polished is less than −55 my and −100 mV or more.

PTL 3 listed below discloses a polishing pad that can perform polishing with a low load without causing defects in an insulating layer during CMP, and that is fixed to a platen when used for polishing. PTL 3 discloses a polishing pad wherein a material having a tensile modulus at room temperature of 0.2 GPa or more, and a zeta potential of +0.1 to +30 mV in a pH region of a slurry supplied between an object to be polished and the polishing pad is used for at least a portion of the polishing surface. PTL 3 also discloses, as a comparative example, a polishing pad wherein the zeta potential is −8.5 mV when CMP is performed using an acidic slurry having a pH of 3 to 5.

Meanwhile, polyurethanes are preferably used as the materials of polishing layers of polishing pads. A polyurethane is produced by reacting a urethane raw material including a chain extender, a polymer polyol, an organic polyisocyanate, and the like. For example, PTL 4 listed below discloses a chain extender including an amide group-containing diol that can be used as a raw material component of a polyurethane resin from which a thermoplastic polyurethane resin having good mechanical strength and high thermal stability can be produced.

CITATION LIST

Patent Literatures

[PTL 1] WO 2008-029725
[PTL 2] Japanese Laid-Open Patent Publication No. 2013-018056
[PTL 3] Japanese Laid-Open Patent Publication No. 2005-294661
[PTL 4] Japanese Laid-Open Patent Publication No. 2011-213866

SUMMARY OF INVENTION

Technical Problem

It is an object of the present invention to provide a modification method of a polyurethane that allows the surface properties to be easily modified, a novel polyurethane, a polishing pad, and a modification method of a polishing pad.

Solution to Problem

An aspect of the present invention is directed to a modification method of a polyurethane, including the steps of: preparing a polyurethane having an ethylenically unsaturated bond; and reacting a compound having a conjugated double bond with the ethylenically unsaturated bond. A Diels-Alder reaction is known in which a compound having a conjugated double bond is added to an ethylenically unsaturated bond, to form a 6-membered ring structure. A compound having a conjugated double bond according to the required properties is selected, and is reacted with a polyurethane having an ethylenically unsaturated bond serving as a dienophile in a Diels-Alder reaction, whereby a polyurethane having a functional group according to the type of the compound having a conjugated double bond can be obtained.

Preferably, the polyurethane having an ethylenically unsaturated bond is a polyurethane that has been obtained by reacting a urethane raw material including a compound having an ethylenically unsaturated bond, and that includes a polymer constituent unit derived from the compound having an ethylenically unsaturated bond. With such a polyurethane having an ethylenically unsaturated bond, it is possible to obtain a polyurethane having an ethylenically unsaturated bond serving as a dienophile in a Diels-Alder reaction. Examples of the compound having an ethylenically unsaturated bond include cis-2-butene-1,4-diol, 4,5-bis(hydroxymethyl)imidazole, 5-norbornene-2,3-dimethanol, cis-2-nonene-1-ol, cis-3-nonene-1-ol, cis-3-octene-1-ol, and polybutadiene diol. According to the type of the compound having a conjugated double bond that is reacted with the polyurethane having an ethylenically unsaturated bond serving as a dienophile, it is possible to obtain, for example, a polyurethane having an aldehyde group, a carboxyl group, a sulfonic acid group, a phosphoric acid group, a hydroxyl group, an amino group, or the like.

Another aspect of the present invention is directed to a modification method of a polyurethane, including the steps of: preparing a polyurethane having a conjugated double bond; and reacting a compound having an ethylenically unsaturated bond with the conjugated double bond. According to such a modification method, a compound having an ethylenically unsaturated bond is reacted with a polyurethane having a conjugated double bond, whereby a polyurethane having a functional group according to the type of the compound having an ethylenically unsaturated bond can be obtained.

Preferably, the polyurethane having a conjugated double bond is a polyurethane that has been obtained by reacting a urethane raw material including a compound having a conjugated double bond, and that includes a polymer constituent unit derived from the compound having a conjugated double bond. Such a polyurethane has a conjugated double bond in the molecule of the polyurethane. Examples of the compound having a conjugated double bond include polyethylene furanoate. According to the type of the compound having an ethylenically unsaturated bond that is reacted with the polyurethane having a conjugated double bond, it is possible to obtain, for example, a polyurethane having an aldehyde group, a carboxyl group, a sulfonic acid group, a phosphoric acid group, a hydroxyl group, or an amino group.

Another aspect of the present invention is directed to a polyurethane having an ethylenically unsaturated bond. The surface properties of such a polyurethane can be modified by adding a compound having a conjugated double bond to the ethylenically unsaturated bond. For example, when carboxyl group is retained, a polyurethane suitably used for the polishing surface of a polishing pad having a zeta potential at a pH of 3.0 of −1.0 mV or less can be obtained. Such a polyurethane is preferable since it exhibits high affinity for abrasive grains, not only in the case of using an alkaline slurry, but also in the case of using an acidic slurry.

Another aspect of the present invention is directed to a polyurethane having a conjugated double bond. The surface properties of such a polyurethane can be modified by adding a compound having an ethylenically unsaturated bond to the conjugated double bond to introduce a functional group. For example, when carboxyl group is retained, a polyurethane suitably used for the polishing surface of a polishing pad having a zeta potential at a pH of 3.0 of −1.0 mV or less can be obtained.

Another aspect of the present invention is directed to a polishing pad including, in at least a polishing surface thereof, one of the above-described polyurethanes, wherein the polishing pad has a zeta potential at a pH of 3.0 of −1.0 mV or less. Such a polishing pad is preferable since it exhibits high affinity for abrasive grains, not only in the case of using an alkaline slurry, but also in the case of using an acidic slurry.

Another aspect of the present invention is directed to a modification method of a polishing pad, including the steps of: preparing a polishing pad including, in at least a polishing surface thereof, a resin having a reactive site; and reacting a compound with the reactive site to add a functional group. According to such a modification method of a polishing pad, it is possible to modify the surface properties of the polishing surface after producing the polishing pad.

Preferably, the functional group is an anionic functional group or a cationic functional group. The polishing surface can be modified to be negative in the case of adding an anionic functional group to the polishing surface, and the polishing surface can be modified to be positive in the case of adding a cationic functional group to the polishing surface. Through such modification, the zeta potential of the polishing surface can be changed. In addition, in the case of introducing a hydroxyl group into the polishing surface, the hydrophilicity of the polishing surface can be improved.

Particularly preferably, the zeta potential of the polishing surface is changed by the addition of the functional group. In this case, it is particularly preferable that the zeta potential is changed by 3 mV or more, for example, at a pH of 5, and preferably in the entire range of a pH of 5 to 8.

Advantageous Effects of Invention

According to the present invention, it is possible to obtain a novel polyurethane whose surface properties have been modified. In addition, it is possible to easily modify the surface properties of the polishing surface of a polishing pad.

DESCRIPTION OF EMBODIMENTS

First Embodiment

Figure 1:
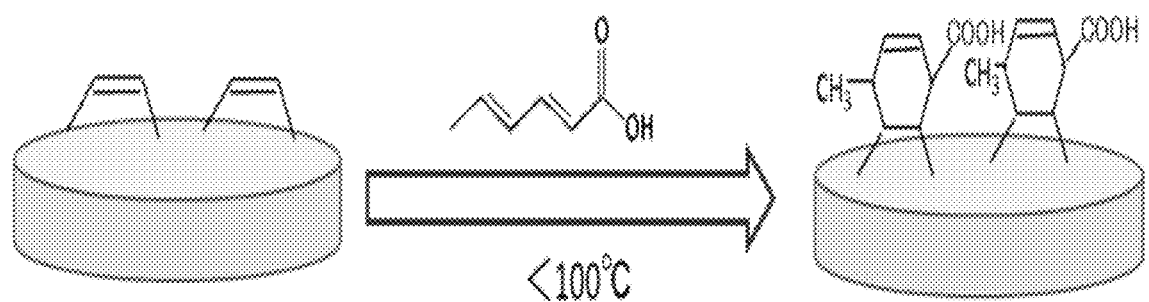
FIG. 1 is an explanatory diagram illustrating a process of treating a polyurethane having an ethylenically unsaturated bond using an aqueous solution of sorbic acid, thereby modifying the polyurethane into a polyurethane having a carboxyl group.

A first embodiment of a modification method of a polyurethane according to the present invention will be described below. The modification method of a polyurethane according to the first embodiment includes the steps of preparing a polyurethane having an ethylenically unsaturated bond; and reacting a compound having a conjugated double bond with the ethylenically unsaturated bond of the polyurethane.

The polyurethane having an ethylenically unsaturated bond can be obtained by mixing, in a urethane raw material containing a chain extender, a polymer polyol, an organic polyisocyanate, and the like, for example, a chain extender having an ethylenically unsaturated bond as the chain extender, a polymer polyol having an ethylenically unsaturated bond as the polymer polyol, or a compound having an ethylenically unsaturated bond as a terminal modifier. Note that an ethylenically unsaturated bond is an unsaturated bond for serving as a dienophile in a Diels-Alder reaction. In addition, a conjugated double bond is a structure having two or more conjugated cis-double bonds in a conjugated diene or a conjugated ring structure, for being added to the ethylenically unsaturated bond of the dienophile of the polyurethane in a Diels-Alder reaction.

As the chain extender having an ethylenically unsaturated bond, any low-molecular weight compound that includes, in its molecule, two or more active hydrogen atom-containing hydroxyl groups, amino groups, or the like capable of reacting with an isocyanate group, and that has an ethylenically unsaturated bond in the molecule can be used without any particular limitation. Specific examples of such a compound include cis-2-butene-1,4-diol and 5-norbornene-2,3-dimethanol. These may be used alone or in a combination of two or more. Among these, cis-2-butene-1,4-diol is particularly preferable in that the reactivity and the mechanical properties can be easily maintained.

Examples of the polymer diol having an ethylenically unsaturated bond include polymer polyols such as a polyether polyol, a polyester polyol, and a polycarbonate polyol that have an ethylenically unsaturated bond in the molecules. Specific examples of such a polymer polyol include polybutadiene diol. These may be used alone or in a combination of two or more.

Examples of the terminal modifier having an ethylenically unsaturated bond include cis-2-nonene-1-ol, cis-3-nonene-1-ol, and cis-3-octene-1-ol. These may be used alone or in a combination of two or more. Among these, cis-3-nonene-1-ol is particularly preferable in terms of the reactivity.

As chain extenders other than the chain extender having an ethylenically unsaturated bond, polymer polyol other than the polymer polyol having an ethylenically unsaturated bond, and the organic polyisocyanate, any chain extenders, polymer polyols, and organic polyisocyanates that have been conventionally used as urethane raw materials can be used without any particular limitation. Note that in the case of producing a thermoplastic polyurethane, it is preferable to use a polymer diol as the polymer polyol in order to maintain the thermoplasticity. Also, in the case of producing a thermoplastic polyurethane, it is preferable to use an organic diisocyanate as the organic polyisocyanate in order to maintain the thermoplasticity.

For the production of a polyurethane having an ethylenically unsaturated bond, any urethanation reaction using a known prepolymer method or one-shot method through solution polymerization or melt-polymerization, which are conventionally known polyurethane polymerization methods, can be used without any particular limitation, except that compounds having an ethylenically unsaturated bond such as a chain extender, a polymer polyol, and organic polyisocyanate, a terminal modifier, and the like that have an ethylenically unsaturated bond are mixed in the urethane raw material. In addition, the polyurethane may be a foamed polyurethane or a non-foamed polyurethane, or may be a thermosetting polyurethane or a thermoplastic polyurethane.

In the case of mixing a chain extender or a polymer polyol having an ethylenically unsaturated bond in a urethane raw material including a compound having an ethylenically unsaturated bond, the proportion of the chain extender having an ethylenically unsaturated bond relative to the total amount of chain extenders, and the proportion of the chain extender having an ethylenically unsaturated bond relative to the total amount of polymer polyols can be appropriately selected according to the purpose, and is, for example, preferably 5 to 95 mol %, and more preferably 10 to 90 mol %. When the content ratio of the compound having an ethylenically unsaturated bond is too low, the modifying effect tends to be reduced.

The modification method of a polyurethane according to the first embodiment includes the step of reacting a compound having a conjugated double bond with the ethylenically unsaturated bond of the polyurethane having an ethylenically unsaturated bond described above.

The compound having a conjugated double bond according to the first embodiment is a compound that has a conjugated cis-double bond, and that is added to an ethylenically unsaturated bond by a Diels-Alder reaction to form a 6-membered ring structure. Specific examples of such a compound include carboxyl group-containing cis-compounds such as a carboxyl group-containing cis-diene compound including, for example, sorbic acid, 2,5-furandicarboxylic acid, and 2-furan carboxylic acid, or metal salts thereof including, for example, potassium sorbate; hydroxyl group-containing cis-compounds such as a hydroxyl group-containing cis-diene compound including, for example, furfuryl alcohol; amino group-containing cis-compounds such as an amino group-containing cis-diene compound including, for example, divinylenimine; sulfonic acid group-containing cis-compounds such as a 2-naphthalene sulfonic acid hydrate; phosphoric acid group-containing cis-compounds such as a 1-naphthyl phosphoric acid sodium hydrate; and imidazole group-containing cis-compounds such as imidazole and 1H-imidazole-4,5-dicarboxylic acid. Among these, the carboxyl group-containing compounds and the sulfonic acid group-containing compounds are preferable from the viewpoint that the polishing surface of the polishing pad can be modified to be negative. Also, the amino group-containing compounds and the imidazole group-containing compounds are preferable from the viewpoint that the polishing surface of the polishing pad can be modified to be positive. Also, the hydroxyl group-containing compounds are preferable from the viewpoint that the polishing surface of the polishing pad can be modified to be hydrophilic.

As the treating method and the treating conditions for reacting the compound having a conjugated double bond with the ethylenically unsaturated bond of the polyurethane, a suitable treating method and treating conditions can be appropriately selected according to the type of combination of the ethylenically unsaturated bond and the compound having a conjugated double bond. Specific examples thereof include a method in which a molded body of a polyurethane having an ethylenically unsaturated bond that has been prepared in advance is immersed in an aqueous solution in which the compound having a conjugated double bond is dissolved, and allowed to stand for a predetermined time. The method and the conditions in this case are not limited, but examples thereof include a method and conditions in which the molded body of a polyurethane having an ethylenically unsaturated bond is immersed in an aqueous solution at preferably 100° C. or less, and more preferably 30 to 80° C. of the compound having a conjugated double bond for 1 to 24 hours. Although the concentration of the compound having a conjugated double bond in the aqueous solution is also not limited, a concentration of 0.2 to 15 mass % can be selected, for example.

Examples of other methods include a method in which, if the polyurethane having an ethylenically unsaturated bond has been obtained through solution polymerization, the compound having a conjugated double bond is dissolved in a solution of the polyurethane after polymerization, and allowed to stand for a predetermined time. Examples of the solvent for the solution in which the compound having a conjugated double bond is dissolved include, but are not particularly limited to, N-methyl pyrrolidone (NMP) and N,N-dimethylformamide (DMF).

In this manner, a polyurethane can be obtained in which a compound having a conjugated double bond has been added by a Diels-Alder reaction to the ethylenically unsaturated bond of a polyurethane having an ethylenically unsaturated bond. With such a polyurethane, various functional groups such as a carboxyl group, a sulfonic acid group, a phosphoric acid group, a hydroxyl group, an amino group, and an imidazole group can be added to a polyurethane according to the type of the compound having a conjugated double bond that is added to the ethylenically unsaturated bond. In addition, the functional group that has been added to the polyurethane can be further converted into another functional group. Specifically, the carboxyl group can also be further converted into an aldehyde group by reduction.

Specifically, as an example, when a polyurethane having an ethylenically unsaturated bond is treated with an aqueous solution of sorbic acid, a polyurethane having a carboxyl group can be obtained by addition reaction of the sorbic acid with the ethylenically unsaturated bond in the molecular chain of the polyurethane as shown in FIG. 1. In addition, a polyurethane having an aldehyde group can also be obtained by reduction of that carboxyl group.

Figure 2:
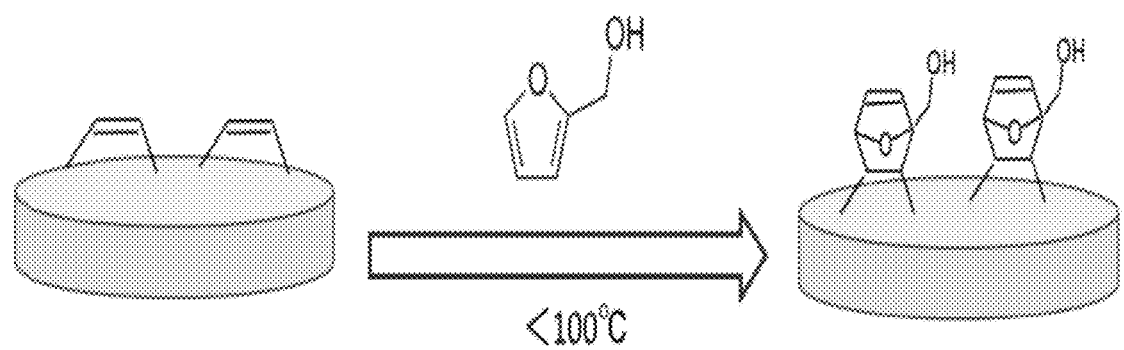
FIG. 2 is an explanatory diagram illustrating a process of treating a polyurethane having an ethylenically unsaturated bond using an aqueous solution of furfuryl alcohol, thereby modifying the polyurethane into a polyurethane having a hydroxyl group.
Figure 3:
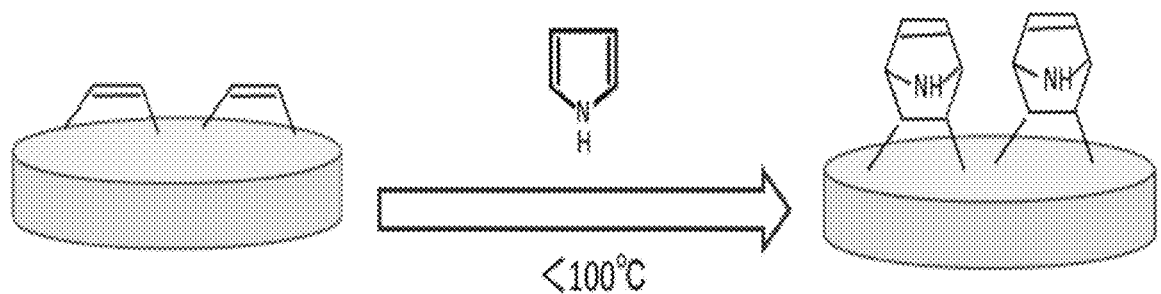
FIG. 3 is an explanatory diagram illustrating a process of treating a polyurethane having an ethylenically unsaturated bond using an aqueous solution of divinylenimine, thereby modifying the polyurethane into a polyurethane having an amino group.

When a polyurethane having an ethylenically unsaturated bond is treated with an aqueous solution of furfuryl alcohol, a polyurethane having a hydroxyl group can be obtained by addition reaction of the furfuryl alcohol with the ethylenically unsaturated bond in the molecular chain of the polyurethane as shown in FIG. 2. Furthermore, when a polyurethane having an ethylenically unsaturated bond is treated with an aqueous solution of divinylenimine, a polyurethane having an amino group can be obtained by addition reaction of the divinylenimine with the ethylenically unsaturated bond as shown in FIG. 3.

As described above, according to the modification method of a polyurethane of the first embodiment, polyurethanes having various functional groups such as a carboxyl group, an aldehyde group, a sulfonic acid group, a phosphoric acid group, a hydroxyl group, an amino group, and an imidazole group can be obtained according to the type of the compound having a conjugated double bond for modifying a polyurethane having an ethylenically unsaturated bond. In the case of a polyurethane having a carboxyl group, the surface electrical properties of the polyurethane can be made negative, for example, as a result of the carboxyl group being negatively ionized in an acidic aqueous solution as will be described later. In the case of a polyurethane having a hydroxyl group, hydrophilicity can be imparted to the surface of the polyurethane by the hydroxyl group. In the case of a polyurethane having an amino group, the surface electrical properties of the polyurethane can be made positive as a result of the amino group being positively ionized in an alkaline aqueous solution. In addition, each of the various functional groups can serve as a starting point for a further reaction, for example, by serving as a crosslinking point.

According to the modification of a polyurethane of the first embodiment, the zeta potential of the surface of a polyurethane at any pH from 3.0 to 8.0 can be changed by 1.5 mV or more, even 2.0 mV or more, particularly 3.0 mV or more, and quite particularly 5.0 mV or more, as compared with that before modification.

Second Embodiment

A second embodiment of the modification method of a polyurethane according to the present invention will be described below. The modification method of a polyurethane according to the second embodiment includes the steps of: preparing a polyurethane having a conjugated double bond; and reacting a compound having an ethylenically unsaturated bond with the conjugated double bond of the polyurethane.

The polyurethane having a conjugated double bond can be obtained, for example, by mixing a compound having a conjugated cis-double bond as a chain extender or a polymer polyol as a urethane raw material including a chain extender, a polymer polyol, an organic polyisocyanate, and the like.

As the chain extender having a conjugated cis-double bond, any low-molecular weight compound with a molecular weight of 300 or less that includes, in its molecule, two or more active hydrogen atom-containing hydroxyl groups, amino groups, or the like capable of reacting with an isocyanate group, and that has a conjugated cis-double bond in its molecule can be used without any particular limitation. Specific examples of such a compound include 4,5-bis (hydroxymethyl) imidazole and 4-hydroxymethyl-5-methylimidazole. These may be used alone or in a combination of two or more. Among these, 4-hydroxymethyl-5-methylimidazole is particularly preferable in terms of the reactivity and the mechanical properties.

Examples of the polymer diol having a conjugated cis-double bond include polymer polyols such as a polyether polyol, a polyester polyol, and a polycarbonate polyol that have a conjugated cis-double bond in the molecules. Specific examples of such a compound include polyethylene furanoate.

As chain extenders other than the chain extender having a conjugated cis-double bond, polymer polyol other than the polymer polyol having a conjugated cis-double bond, and the organic polyisocyanate, any chain extenders, polymer polyols, and organic polyisocyanates that have been conventionally used as the raw materials for producing polyurethanes can be used without any particular limitation. Note that in the case of producing a thermoplastic polyurethane, it is preferable to use a polymer diol as the polymer polyol in order to maintain the thermoplasticity. Also, in the case of producing a thermoplastic polyurethane, it is preferable to use an organic diisocyanate as the organic polyisocyanate in order to maintain the thermoplasticity.

For the production of a polyurethane having a conjugated double bond, any urethanation reaction using a known prepolymer method or one-shot method through solution polymerization or melt-polymerization, which are conventionally known polyurethane polymerization methods, can be used without any particular limitation, except that a chain extender having a conjugated cis-double bond is mixed as the chain extender, and that a polymer polyol having a conjugated cis-double bond is mixed as the polymer polyol.

In addition, the polyurethane may be a foamed polyurethane or a non-foamed polyurethane, or may be a thermosetting polyurethane or a thermoplastic polyurethane.

In the case of using a chain extender or a polymer polyol having a conjugated cis-double bond, the proportion of the chain extender or polymer polyol having a conjugated cis-double bond relative to the total amount of chain extenders can be appropriately selected according to the purpose, and is, for example, preferably 5 to 95 mol %, and more preferably 10 to 90 mol %. When the content ratio of the compound having a conjugated cis-double bond is too low, the modifying effect tends to be reduced.

The modification method of a polyurethane according to the second embodiment includes the step of reacting the conjugated double bond of a polyurethane as described above with a compound having an ethylenically unsaturated bond.

The compound having an ethylenically unsaturated bond according to the second embodiment is a compound that has an ethylenically unsaturated bond, and that is added to a conjugated cis-double bond by a Diels-Alder reaction to form a 6-membered ring structure. Specific examples of such a compound having an ethylenically unsaturated bond include carboxyl group-containing compounds such as maleic acid, maleimide, and fumaric acid; amino group-containing compounds such as 3-amino-1-propene; sulfonic acid group-containing compounds such as 2-acrylamide-2-methylpropane sulfonic acid; phosphoric acid group-containing compound such as vinyl phosphonic acid; and imidazole group-containing compounds such as 1-vinyl imidazole. Among these, maleic acid is particularly preferable in terms of the development of potential change.

As the treating method and the treating conditions for reacting the polyurethane having a conjugated double bond with the compound having an ethylenically unsaturated bond, a suitable treating method and treating conditions can be appropriately selected according to the type of combination of the conjugated double bond and the compound having an ethylenically unsaturated bond. Specific examples thereof include a method in which a molded body of a polyurethane having a conjugated double bond that has been prepared in advance is immersed in an aqueous solution in which the compound having an ethylenically unsaturated bond is dissolved, and allowed to stand for a predetermined time. The method and the conditions in this case are not limited, but examples thereof include a method and conditions in which the molded body of a polyurethane having a conjugated double bond is immersed in an aqueous solution at preferably 100° C. or less, and more preferably 30 to 80° C. of the compound having an ethylenically unsaturated bond for 1 to 24 hours. Although the concentration of the compound having an ethylenically unsaturated bond in the aqueous solution is also not limited, a concentration of 0.2 to 15 mass % can be selected, for example.

Examples of other methods include a method in which, if the polyurethane having a conjugated double bond has been obtained through solution polymerization, the compound having an ethylenically unsaturated bond is dissolved in a solution of the polyurethane after polymerization, and allowed to stand for a predetermined time, to promote the reaction. Examples of the solvent for the solution in which the compound having an ethylenically unsaturated bond is dissolved include, but are not particularly limited to, N-methyl pyrrolidone (NMP) and N,N-dimethylformamide (DMF).

In this manner, a polyurethane can be obtained in which a compound having an ethylenically unsaturated bond has been added by a Diels-Alder reaction to the conjugated double bond of a polyurethane. With such a polyurethane, various functional groups such as a carboxyl group, an aldehyde group, a sulfonic acid group, a phosphoric acid group, a hydroxyl group, an amino group, and an imidazole group can be added to a polyurethane according to the type of the compound having an ethylenically unsaturated bond. In addition, the functional group that has been added to the polyurethane can also be further converted into another functional group.

Figure 4:
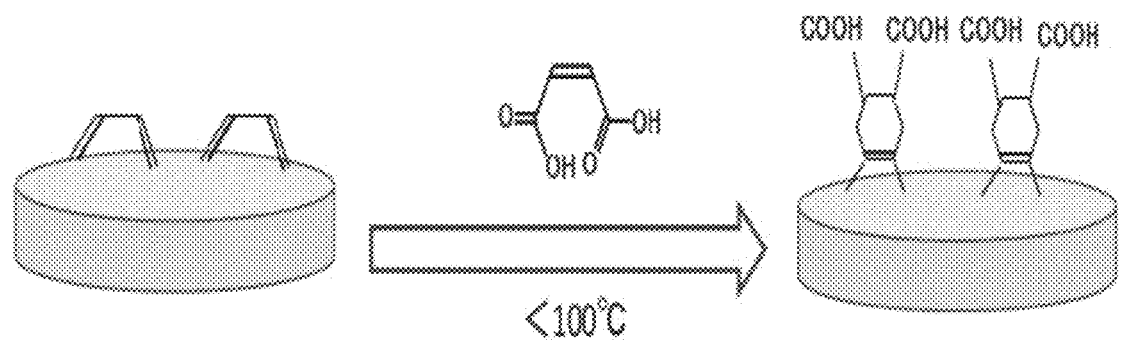
FIG. 4 is an explanatory diagram illustrating a process of modifying a polyurethane having a conjugated double bond into a polyurethane having a carboxyl group, using an aqueous solution of maleic acid.

Specifically, as an example, when a polyurethane having a conjugated double bond is treated with an aqueous solution of maleic acid, a polyurethane having a carboxyl group can be obtained by addition reaction of the maleic acid with the conjugated double bond in the molecular chain of the polyurethane as shown in FIG. 4. In addition, a polyurethane having an aldehyde group can also be obtained by reduction of that carboxyl group.

Figure 5:
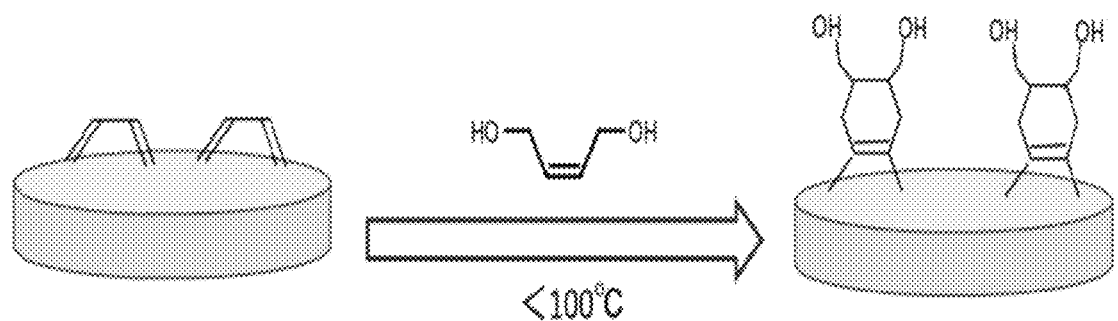
FIG. 5 is an explanatory diagram illustrating a process of modifying a polyurethane having a conjugated double bond into a polyurethane having a hydroxyl group, using an aqueous solution of cis-2-butene-1,4-diol.
Figure 6:
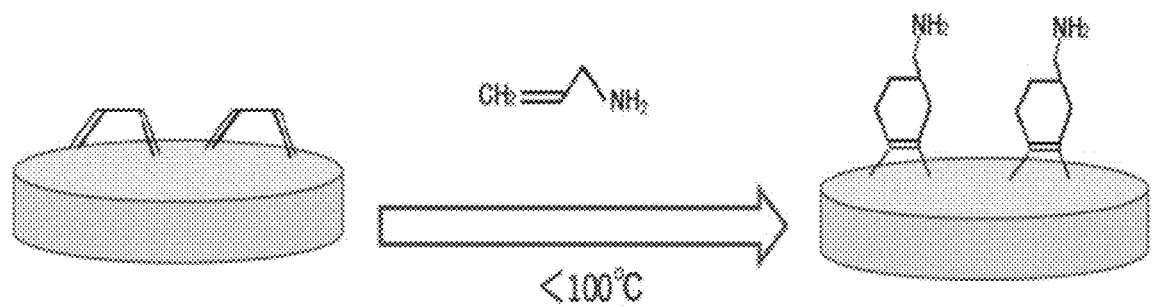
FIG. 6 is an explanatory diagram illustrating a process of modifying a polyurethane having a conjugated double bond into a polyurethane having an amino group, using an aqueous solution of 3-amino-1-propene.

When a polyurethane having a conjugated double bond is treated with an aqueous solution of cis-2-butene-1,4-diol, a polyurethane having a hydroxyl group can be obtained by addition reaction of the cis-2-butene-1,4-diol with the conjugated double bond in the molecular chain of the polyurethane as shown in FIG. 5. Furthermore, when a polyurethane having a conjugated double bond is treated with an aqueous solution of 3-amino-1-propene, a polyurethane having an amino group can be obtained by addition reaction of the 3-amino-1-propene with the conjugated double bond in the molecular chain of the polyurethane as shown in FIG. 6.

According to the modification of a polyurethane of the second embodiment described above, the zeta potential of the surface of a polyurethane at any pH from 3.0 to 8.0 can be changed by 1.5 mV or more, even 2.0 mV or more, particularly 3.0 mV or more, and quite particularly 5.0 mV or more, as compared with that before modification.

As described above, according to the modification method of a polyurethane of the second embodiment, polyurethanes having various functional groups such as a carboxyl group, an aldehyde group, a sulfonic acid group, a phosphoric acid group, a hydroxyl group, an amino group, and an imidazole group can be obtained by selecting the type of the compound having an ethylenically unsaturated bond for treating a polyurethane having a conjugated double bond.

Third Embodiment

The production method of the polyurethane having an ethylenically unsaturated bond according to the first embodiment or the polyurethane having a conjugated double bond according to the second embodiment will be described in further detail, using a method for producing a thermoplastic polyurethane as an example.

A thermoplastic polyurethane can be produced, for example, by performing continuous melt-polymerization of a chain extender, a polymer diol, and an organic diisocyanate substantially in the absence of a solvent, using a single-screw or multi-screw extruder, while melt-mixing the raw materials mixed at predetermined mixing proportions. In this case, a compound having an ethylenically unsaturated bond is mixed when a polyurethane having an ethylenically unsaturated bond according to the first embodiment is produced. On the other hand, a compound having a conjugated double bond is mixed when a polyurethane having a conjugated double bond according to the second embodiment is produced.

Examples of chain extenders other than the compound having an ethylenically unsaturated bond according to the first embodiment and the compound having a conjugated double bond according to the second embodiment include chain extenders, other than these compounds, that have been conventionally used for the production of polyurethanes, that is, low-molecular weight compounds with a molecular weight of 300 or less that include, in its molecule, two or more active hydrogen atom-containing hydroxyl groups or amino groups capable of reacting with an isocyanate group.

Specific examples of chain extenders other than the chain extender serving as the compound having an ethylenically unsaturated bond according to the first embodiment or the chain extender serving as the compound having a conjugated double bond according to the second embodiment include diols such as ethylene glycol, diethylene glycol, 1,2-propane diol, 1,3-propanediol, 2,2-diethyl-1,3-propanediol, 1,2-butane diol, 1,3-butane diol, 2,3-butane diol, 1,4-butane diol, 1,5-pentanediol, neopentyl glycol, 1,6-hexanediol, 3-methyl-1,5-pentanediol, 1,4-bis(β-hydroxyethoxy)benzene, 1,4-cyclohexanediol, cyclohexane dimethanol (1,4-cyclohexane dimethanol, etc.), bis(β-hydroxyethyl)terephthalate, 1,9-nonane diol, m-xylylene glycol, p-xylylene glycol, diethylene glycol, and triethylene glycol; and diamines such as ethylenediamine, trimethylenediamine, tetramethylenediamine, hexamethylenediamine, heptamethylenediamine, octamethylenediamine, nonamethylenediamine, decamethylenediamine, undecamethylenediamine, dodecamethylenediamine, 2,2,4-trimethylhexamethylenediamine, 2,4,4-trimethylhexamethylenediamine, 3-methylpentamethylenediamine, 1,2-cyclohexanediamine, 1,3-cyclohexanediamine, 1,4-cyclohexanediamine, 1,2-diaminopropane, hydrazine, xylylene diamine, isophoronediamine, piperazine, o-phenylenediamine, m-phenylenediamine, p-phenylenediamine, tolylenediamine, xylenediamine, adipic acid dihydrazide, isophthalic acid dihydrazide, 4,4'-diaminodiphenylmethane, 4,4'-diaminodiphenyl ether, 4,4'-bis(4-aminophenoxy)biphenyl, 4,4'-bis(3-aminophenoxy)biphenyl, 1,4-bis(4-aminophenoxy)benzene, 1,3-bis(4-aminophenoxy)benzene, 1,3-bis(3-aminophenoxy)benzene, 3,4'-diaminodiphenyl ether, 4,4'-diaminodiphenyl sulfone, 3,4-diaminodiphenyl sulfone, 3,3'-diaminodiphenyl sulfone, 4,4'-methylene-bis(2-chloroaniline), 3,3'-dimethyl-4,4'-diaminobiphenyl, 4,4'-diaminodiphenyl sulfide, 2,6-diaminotoluene, 2,4-diaminochlorobenzene, 1,2-diaminoanthraquinone, 1,4-diaminoanthraquinone, 3,3'-diaminobenzophenone, 3,4-diaminobenzophenone, 4,4'-diaminobenzophenone, 4,4'-diaminobibenzyl, 2,2'-diamino-1,1'-binaphthalene, 1,n-bis(4-aminophenoxy)alkanes (n is 3 to 10), including, for example, 1,3-bis(4-aminophenoxy)alkane, 1,4-bis(4-aminophenoxy)alkane and 1,5-bis(4-aminophenoxy)alkane, 1,2-bis [2-(4-aminophenoxy)ethoxy]ethane, 9,9-bis(4-aminophenyl) fluorene, and 4,4'-diaminobenzanilid. These may be used alone or in a combination of two or more. Among these, 1,4-butane diol is preferable.

Examples of polymer diols other than the polymer diol serving as the compound having an ethylenically unsaturated bond according to the first embodiment or the polymer diol serving as the compound having a conjugated double bond according to the second embodiment include polymer diols, other than these compounds, that have been conventionally used for the production of thermoplastic polyurethanes.

Specific examples of polymer diols other than the polymer diol serving as the compound having an ethylenically unsaturated bond according to the first embodiment or the polymer diol serving as the compound having a conjugated double bond according to the second embodiment include polyether diol, polyester diol, polycarbonate diol, and the like other than these compounds. These may be used alone or in a combination of two or more. Among these, polyether diol and polyester diol are preferable. The number-average molecular weight of the polymer diol is preferably 450 to 3000, more preferably 500 to 2700, and particularly preferably 500 to 2400, since a polishing surface for which the required properties such as the rigidity, the hardness, and the hydrophilicity are maintained can be easily obtained. Note that the number-average molecular weight of the polymer diol means a number-average molecular weight calculated based on the hydroxyl value measured in accordance with JIS K 1557.

Specific examples of the polyether diol include polyethylene glycol, polypropylene glycol, polytetramethylene glycol, poly(methyltetramethylene glycol), and glycerin-based polyalkylene ether glycol. These may be used alone or in a combination of two or more. Among these, it is preferable to use polyethylene glycol and polytetramethylene glycol, and in particular, polytetramethylene glycol is preferable.

A polyester diol can be obtained, for example, by a direct esterification reaction or a transesterification reaction of a dicarboxylic acid or an ester or ester-forming derivative (anhydride, etc.) thereof and a low-molecular weight diol.

Specific examples of the dicarboxylic acid or an ester or ester-forming derivative (anhydride, etc.) thereof for producing the polyester diol include C2-12 aliphatic dicarboxylic acids such as oxalic acid, succinic acid, glutaric acid, adipic acid, pimelic acid, suberic acid, azelaic acid, sebacic acid, dodecanedicarboxylic acid, 2-methyl succinic acid, 2-methyl adipic acid, 3-methyl adipic acid, 3-methylpentanedioic acid, 2-methyloctanedioic acid, 3,8-dimethyldecanedioic acid, and 3,7-dimethyldecanedioic acid; aliphatic dicarboxylic acids such as C14-48 dimerized aliphatic dicarboxylic acids (dimer acids) obtained by the dimerization of unsaturated fatty acids obtained by the fractional distillation of triglycerides, as well as hydrogenated products (hydrogenated dimer acids) therefrom; alicyclic dicarboxylic acids such as 1,4-cyclohexane dicarboxylic acid; and aromatic dicarboxylic acids such as terephthalic acid, isophthalic acid, and ortho-phthalic acid. Specific examples of the dimer acid and the hydrogenated dimer acid include "Pripol 1004", "Pripol 1006", "Pripol 1009", and "Pripol 1013" (trade names, manufactured by Unichema). These may be used alone or in a combination of two or more.

Specific examples of the low-molecular weight diol for producing the polyester diol include: aliphatic diols such as ethylene glycol, 1,3-propanediol, 1,2-propanediol, 2-methyl-1,3-propanediol, 1,4-butanediol, neopentyl glycol, 1,5-pentanediol, 3-methyl-1,5-pentanediol, 1,6-hexanediol, 1,7-heptanediol, 1,8-octanediol, 2-methyl-1,8-octanediol, 1,9-nonanediol, and 1,10-decanediol; and alicyclic diols such as cyclohexanedimethanol and cyclohexanediol. These may be used alone or in a combination of two or more. Among these, C6 to 12 diols are preferable, C8 to 10 diols are more preferable, and C9 diols are particularly preferable.

Examples of the polycarbonate diol include polycarbonate diols obtained by the reaction of a low-molecular weight diol and a carbonate compound such as dialkyl carbonate, alkylene carbonate, and diaryl carbonate. Examples of the low-molecular weight diol for producing the polycarbonate diol include the low-molecular weight diols listed above as examples. Examples of the dialkyl carbonate include dimethyl carbonate and diethyl carbonate. Examples of the alkylene carbonate include ethylene carbonate. Examples of the diaryl carbonate include diphenyl carbonate.

As the organic diisocyanate, any organic diisocyanate that has been conventionally used for the production of polyurethanes can be used without any particular limitation. Specific examples thereof include aliphatic or alicyclic diisocyanates such as ethylene diisocyanate, tetramethylene diisocyanate, pentamethylene diisocyanate, hexamethylene diisocyanate, 2,2,4-trimethylhexamethylene diisocyanate, 2,4,4-trimethylhexamethylene diisocyanate, dodecamethylene diisocyanate, isophorone diisocyanate, isopropylidene bis(4-cyclohexyl isocyanate), cyclohexylmethane diisocyanate, methylcyclohexane diisocyanate, 4,4'-dicyclohexylmethane diisocyanate, lysine diisocyanate, 2,6-diisocyanatomethyl caproate, bis(2-isocyanatoethyl)fumarate, bis(2-isocyanatoethyl)carbonate, 2-isocyanatoethyl-2,6-diisocyanatohexanoate, cyclohexylene diisocyanate, methylcyclohexylene diisocyanate, and bis(2-isocyanatoethyl)-4-cyclohexylene; and aromatic diisocyanates such as 2,4'-diphenylmethane diisocyanate, 4,4'-diphenylmethane diisocyanate, 2,4-tolylene diisocyanate, 2,6-tolylene diisocyanate, m-phenylene diisocyanate, p-phenylene diisocyanate, m-xylylene diisocyanate, p-xylylene diisocyanate, 1,5-naphthylene diisocyanate, 4,4'-diisocyanatobiphenyl, 3,3'-dimethyl-4,4'-diisocyanatobiphenyl, 3,3'-dimethyl-4,4'-diisocyanatodiphenylmethane, chlorophenylene-2,4-diisocyanate, and tetramethylxylylene diisocyanate. These may be used alone or in a combination of two or more.

The mixing proportions of the various components are appropriately adjusted according to the intended characteristics. For example, the components are preferably mixed at such proportions that the isocyanate group contained in the organic polyisocyanate is preferably 0.95 to 1.3 moles, more preferably 0.96 to 1.10 moles, and particularly preferably 0.97 to 1.05 mol, per mole of the active hydrogen atoms contained in the polymer diol and the chain extender. When the proportion of the isocyanate group contained in the organic diisocyanate is too low, the mechanical strength and the abrasion resistance of the thermoplastic polyurethane tend to be reduced, resulting in a shorter life of the polishing layer. When the proportion is too high, the productivity and the storage stability of the thermoplastic polyurethane tend to be reduced, thus making it difficult to produce the polishing layer.

The thermoplastic polyurethane obtained by performing continuous melt-polymerization as described above can be, for example, pelletized, and subsequently molded into a sheet-like molded body by using any one of various molding methods such as extrusion molding, injection molding, blow molding, and calendering. In particular, it is preferable to use extrusion molding with a T-die since a sheet-like molded body having a uniform thickness can be obtained.

The thermoplastic polyurethane may optionally contain additives such as a cross-linking agent, a filler, a cross-linking accelerator, a cross-linking auxiliary, a softening agent, a tackifier, an aging inhibitor, a foaming agent, a processing auxiliary, an adhesion-imparting agent, an inorganic filler, an organic filler, a crystal nucleating agent, a heat stabilizer, a weathering stabilizer, an antistatic agent, a colorant, a lubricant, a flame retardant, a flame retardant auxiliary (antimony oxide etc.), a blooming inhibitor, a release agent, a thickener, an antioxidant, and a conductive agent. The content ratio of the additive in the thermoplastic polyurethane is not particularly limited, but is preferably 50 mass % or less, more preferably 20 mass % or less, and particularly preferably 5 mass % or less.

In the above-described manner, a polyurethane having an ethylenically unsaturated bond according to the first embodiment or a polyurethane having a conjugated double bond according to the second embodiment, each of which is a thermoplastic polyurethane, is polymerized.

In the foregoing, the method for performing the melt-polymerization of a thermoplastic polyurethane has been described in detail. Note that the polymerization of polyurethanes is not limited to melt-polymerization, and polyurethanes can also be produced by solution polymerization using DMF as a solvent, for example.

Fourth Embodiment

The polyurethanes described in the first to third embodiments that have been modified so as to have various functional groups can be suitably used as the materials of polishing pads by utilizing the surface properties achieved by the functional groups. In the following, an example of such a polishing pad will be described.
(First Polishing Pad)

For example, as the slurry used for CMP, an acidic slurry and an alkaline slurry are available. The acidic slurry and the alkaline slurry may be selectively used according to the purpose of polishing, or may be used in combination in the case of performing a multi-step polishing process. The abrasive grains contained in the alkaline slurry usually have a negative zeta potential. In the case of using an alkaline slurry, the abrasive grains having a negative zeta potential repel the polishing surface including a polyurethane whose zeta potential is negative in an alkaline condition, so that polishing debris are less likely to adhere to the polishing surface, thus reducing the occurrence of scratches and defects. However, even in the case of a polyurethane whose zeta potential is negative in an alkaline condition, the zeta potential of the polyurethane is often positive when an acidic slurry is used.

In the acidic slurry, the abrasive grains often have a positive zeta potential. On the other hand, for example, the zeta potential of the surface of a silicon wafer is usually negative in an acidic condition. In this case, the negative electric charge on the surface of the silicon wafer and the positive electric charge of the abrasive grains contained in the acidic slurry attract each other, thus resulting in high mutual affinity. On the other hand, the zeta potential of a commonly used polyurethane tends to be positive in an acidic region, in particular, a pH region lower than a pH of 3, reach the isoelectric point near a pH of 3 to approach 0, and to be negative in an alkaline region having a high pH.

In the case of using an acidic slurry, when a surface to be polished whose zeta potential is negative is polished with a polishing surface containing a polyurethane whose zeta potential is positive by using abrasive grains whose zeta potential is positive, the polyurethane having a positive zeta potential and the abrasive grains having a positive zeta potential repel each other, resulting in poor affinity. Therefore, in the case of using an acidic slurry, when a surface to be polished, whose zeta potential is negative, of a base material is polished by using an acidic slurry containing abrasive grains whose zeta potential is positive, it is preferable to use a polishing surface containing a polyurethane whose zeta potential is negative in the acidic region. In such a case, the abrasive grains that exhibit a positive zeta potential are interposed between the surface to be polished that exhibits a negative zeta potential and the polishing surface that exhibits a negative zeta potential, so that the abrasive grains exhibit high affinity for both the surface to be polished and the polishing surface. As a result, the polishing rate is improved.

Figure 7A:
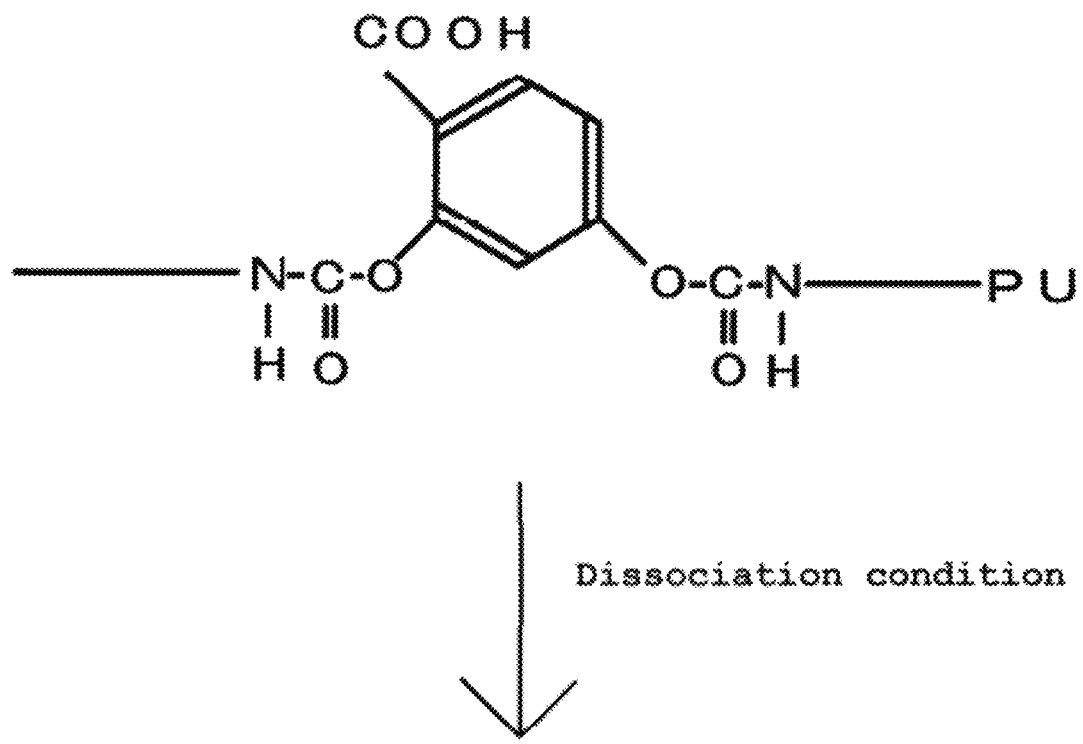
FIG. 7 is an explanatory diagram illustrating the dissociation of a carboxyl group introduced into a polyurethane.
Figure 7B:
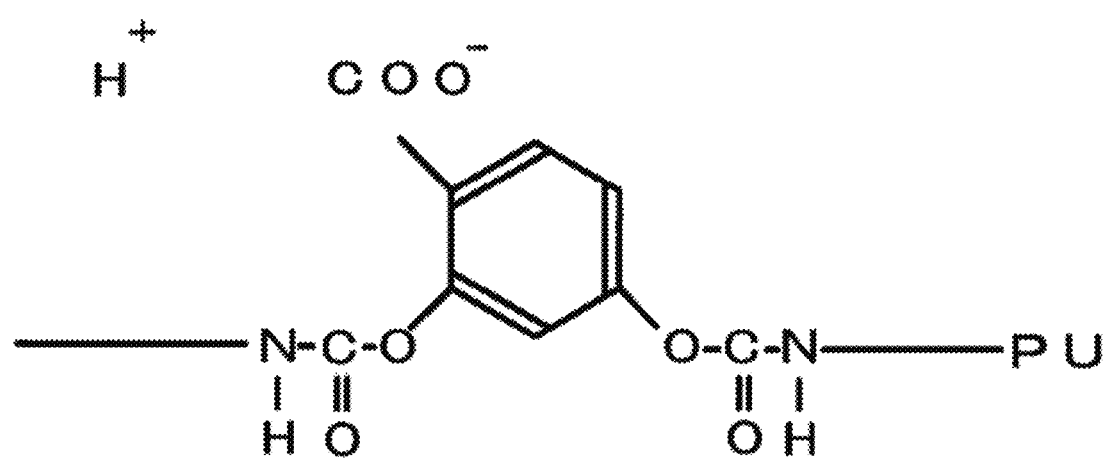

The first polishing pad is a polishing pad containing, in a polishing surface thereof, a polyurethane having a carboxyl group that exhibits anionic properties. As shown in FIG. 7, when the carboxyl group of the polyurethane comes into contact with an aqueous solution having a pH in the acidic region that causes ionization of the carboxyl group, the carboxyl group is dissociated into —COO⁻ and H⁺. Then, the —COO⁻ in the surface imparts a negative potential to the surface of the polyurethane. Accordingly, when the surface of a polyurethane having a carboxyl group comes into contact with a slurry that causes ionization of the carboxyl group, for example, a slurry having a pH of 3.0, the carboxyl group in the surface is dissociated into —COO⁻, thus making it possible to form a surface having a zeta potential of −1.0 mV or less. A polishing pad containing such a polyurethane in the polishing surface has a zeta potential at a pH of 3.0 of −1.0 mV or less, i.e., a negative zeta potential, when the polishing surface comes into contact with an acidic slurry, so that the polishing pad exhibits high affinity for the abrasive grains that exhibit a positive zeta potential in the acidic region. Also, the abrasive grains that exhibit a positive zeta potential are interposed between the surface to be polished, whose zeta potential is negative in the acidic region, of the base material and the polishing surface that exhibits a negative zeta potential, so that the abrasive grains exhibit high affinity for both the surface to be polished and the polishing surface. As a result, a high polishing rate is achieved.

The zeta potential at a pH of 3.0 of the polyurethane contained in the polishing surface of the first polishing pad is preferably −1.0 to −40 mV, more preferably −2.0 to −30 mV, particularly preferably −3.0 to −27 mV, and quite particularly preferably −5.0 to −20 mV. When the zeta potential at a pH of 3.0 of the polyurethane contained in the polishing surface of the first polishing pad is too high, the abrasive grains and the polishing surface electrically repel each other, thus resulting in low affinity. On the other hand, when the zeta potential at a pH of 3.0 of the polyurethane contained in the polishing surface of the first polishing pad is too low, an excessive amount of the abrasive grains is retained in the polishing surface, so that more scratches may tend to occur on the surface to be polished. Here, a zeta potential is a potential that is generated on the surface (slip plane) of an electric double layer by counter ion according to the surface electric charge of a substance when the substance comes into contact with a liquid. In the present embodiment, the zeta potential is a zeta potential measured with an electrophoretic light scattering device (ELS-Z, manufactured by Otsuka Electronics Co., Ltd.), using a monitor latex (manufactured by Otsuka Electronics Co., Ltd.) dispersed in a 10 mM aqueous NaCl solution that had been adjusted to a pH of 3.0 with an aqueous HCl solution.

The zeta potential at a pH of 5.0 of the polyurethane contained in the polishing surface of the first polishing pad is preferably −1.0 mV or less, more preferably −5.5 to −40 mV, particularly preferably −7.5 to −30 mV, and quite particularly preferably −10 to −30 mV, since a polishing surface having a zeta potential at a pH of 3.0 of −1.0 mV or less can be easily obtained.

(Second Polishing Pad)

The slurry used for CMP is usually an aqueous dispersion using an aqueous medium such as water. Accordingly, the higher the hydrophilicity of the surface of the polishing surface that comes into contact with the slurry on a polishing pad used for CMP, the higher the affinity of the surface with the slurry.

The second polishing pad is a polishing pad containing, in a polishing surface thereof, a polyurethane that retains a hydroxyl group. The hydroxyl group of the polyurethane that retains a hydroxyl group increases the hydrophilicity of the polyurethane surface, thus enhancing the wettability thereof. The polishing pad containing the polyurethane that retains a hydroxyl group in the polishing surface is imparted with hydrophilicity by the hydroxyl group in the surface. As a result, the polishing surface achieves a high polishing rate when coming into contact with an aqueous slurry.

(Third Polishing Pad)

A polyurethane of a third example used as a material of a polishing pad according to the present embodiment has, in a polishing surface thereof, an amino group or an imidazole group that exhibits cationic properties. In the case of using the polishing pad containing, in the polishing surface thereof, a polyurethane having an amino group or an imidazole group, it is possible to provide a polishing pad having a polishing surface whose zeta potential is also positive in a basic region. The high affinity is developed between the polishing surface that exhibits a positive zeta potential and the abrasive grains that exhibit a negative zeta potential.

Each of the polyurethanes that form the polishing surfaces shown above as examples has a storage modulus at 50° C. after swollen to saturation with water at 50° C., of preferably 50 to 1200 MPa, more preferably 100 to 1100 MPa, and particularly preferably 200 to 1000 MPa. When the storage modulus at 50° C. after swollen to saturation with water at 50° C. of the polyurethane is too low, the polishing layer including the polishing surface becomes too soft, so that the polishing rate is reduced. When it is too high, increased scratches tend to occur on the surface to be polished of the object to be polished.

The content of the nitrogen atoms derived from the isocyanate group of the polyurethane contained in the polishing layer including each of the polishing surfaces is preferably 4.5 to 7.6 mass %, more preferably 5.0 to 7.4 mass %, and particularly preferably 5.2 to 7.3 mass %, since a thermoplastic polyurethane having a storage modulus at 50° C. after swollen to saturation with water at 50° C., of 50 to 1200 MPa can be easily obtained.

The contact angle with water of the polyurethane contained in the polishing layer including each of the polishing surfaces is preferably 80 degrees or less, more preferably 78 degrees or less, particularly preferably 76 degrees or less, and quite particularly preferably 74 degrees or less. When the contact angle with water of the polyurethanes is too large, the hydrophilicity of the polishing surface is reduced, so that scratches tend to increase.

The polishing layer including each of the polishing surfaces is finished into a polishing layer, for example, by adjusting the dimensions, shape, thickness and the like of a sheet-like molded body of the thermoplastic polyurethane through cutting, slicing, punching, and the like. The thickness of the polishing layer is not particularly limited, but is preferably 0.3 to 5 mm, more preferably 1.7 to 2.8 mm, and particularly preferably 2.0 to 2.5 mm, because of the ease of production and handling, and the stability of the polishing performance.

The hardness of each of the polishing layers is preferably 60 or more, and more preferably 65 or more, as a JIS-D hardness. When the JIS-D hardness is too low, the ability of the polishing pad to follow the surface to be polished tends to be high, resulting in a reduction in the local flatness.

Preferably, recesses such as grooves and holes are formed in a pattern such as a spiral, concentric, or grid pattern in the polishing surface of each of the polishing layers by grinding or laser processing. Such recesses are useful for uniformly and sufficiently supplying a slurry to the polishing surface, as well as discharging polishing debris that could cause scratches, and preventing a damage to the wafer caused by adsorption by the polishing layer. For example, in the case of forming grooves concentrically, the interval between the grooves is preferably about 1.0 to 50 mm, more preferably about 1.5 to 30 mm, and particularly preferably about 2.0 to 15 mm. The width of the grooves is preferably about 0.1 to 3.0 mm, and more preferably about 0.2 to 2.0 mm. The depth of the grooves is preferably about 0.2 to 1.8 mm, and more preferably about 0.4 to 1.5 mm. The cross-sectional shape of the grooves may be appropriately selected from, for example, a rectangular shape, a trapezoidal shape, a triangular shape, and a semicircular shape, according to the purpose.

The polyurethane that forms each of the polishing layers may be either a thermoplastic polyurethane or a thermosetting polyurethane. A thermoplastic polyurethane is particularly preferable since it can be continuously produced by continuous melt-polymerization, and also has excellent sheet moldability. The polyurethane that forms each of the polishing layers may be either a foam or a non-foam, but is preferably a non-foam since the polishing characteristics are less likely to vary, thus making it possible to achieve stable polishing. For example, in the case of a polishing layer using a foamed polyurethane produced by forming and curing by casting, the polishing characteristics such as the flatness and the planarization efficiency are likely to vary due to variations of the foam structure, and increasing the hardness for enhancing the flatness tends to be difficult.

In the case of a non-foamed thermoplastic polyurethane, the density of a molded body is preferably 1.0 g/cm$^3$ or more, more preferably 1.1 g/cm$^3$ or more, and particularly preferably 1.2 g/cm$^3$ or more. When the density of the molded body of the thermoplastic polyurethane is too low, the polishing layer tends to become too soft, resulting in a reduction in the local flatness. As the thermoplastic polyurethane, a non-foamed thermoplastic polyurethane is particularly preferable because of the excellent polishing stability provided by high rigidity and material uniformity.

The polishing pad may be formed only by a polishing layer made of any of the above-described polyurethanes, or may be a stack in which a cushioning layer is optionally stacked on the surface of a polishing layer that is different from the polishing surface. It is preferable that the cushioning layer is a layer having a hardness lower than the hardness of the polishing layer. When the hardness of the cushioning layer is lower than the hardness of the polishing layer, the hard polishing layer follows the local irregularities of the surface to be polished, and the cushioning layer follows the warpage and the undulations on the entire base material to be polished, so that it is possible to achieve polishing that is well-balanced in the global flatness and the local flatness.

Specific examples of materials that can be used as the cushioning layer include composites (e.g., "Suba 400" manufactured by (Nitta Haas Incorporated)) obtained by impregnating a non-woven fabric with a polyurethane; rubbers such as a natural rubber, a nitrile rubber, a polybutadiene rubber, and a silicone rubber; thermoplastic elastomers such as a polyester-based thermoplastic elastomer, a polyamide-based thermoplastic elastomer, and a fluorine-based thermoplastic elastomer; foamed plastics; and polyurethanes. Among these, a polyurethane having a foam structure is particularly preferable because flexibility desirable for the cushioning layer can be easily achieved.

The thickness of the cushioning layer is not particularly limited, but is preferably 0.5 to 5 mm, for example. When the cushioning layer is too thin, the effect of following the warpage and the undulations on the entire material to be polished tends to be reduced, resulting in a reduction in the global flatness. On the other hand, when the cushioning layer is too thick, the polishing pad as a whole becomes soft, making it difficult for polishing to be performed in a stable manner. In the case of stacking the cushioning layer on the polishing layer, the thickness of the polishing pad is preferably about 0.3 to 5 mm.

As illustrated above, with the steps of: preparing a polishing pad including, in at least a polishing surface thereof, a resin having a reactive site: and reacting a compound with the reactive site to add a functional group, it is possible to introduce a desired functional group into the polishing surface, thereby modifying the surface properties of the polishing surface after producing the polishing pad. Specifically, the polishing surface can be modified to be negative in the case of introducing an anionic functional group into the reactive site, and the polishing surface can be modified to be positive in the case of introducing a cationic functional group into the reactive site. Through such modification, it is possible to change the zeta potential of the polishing surface. In addition, in the case of introducing a hydroxyl group, it is possible to impart hydrophilicity to the polishing surface.

Note that the reactive site is not particularly limited, as long as it is a site into which a functional group can be introduced by reaction with another compound at a later time, and the reactive site may be either an unsaturated bond or a functional group. In the example of the polyurethane described above, the ethylenically unsaturated bond or the conjugated double bond in the polyurethane serves as a reactive site, to which a desired functional group can be added by reaction with another compound that undergoes a Diels-Alder reaction.

As the modification of the surface properties, a modification to change the zeta potential is particularly preferable. In this case, the zeta potential can be changed by 3 mV or more, even 5 mV or more, and particularly 10 mV or more, for example, at a pH of 5, and preferably in the entire range of a pH of 5 to 8.

Although an example of a polishing pad including a polyurethane in a polishing surface thereof has been described above as a representative example, the above-described modification method of a polishing pad is similarly applicable to a polishing pad having a polishing surface including a resin other than a polyurethane as a material.

[Polishing Method]

Next, one embodiment of CMP using the polishing pad as described above will be described.

Figure 8:
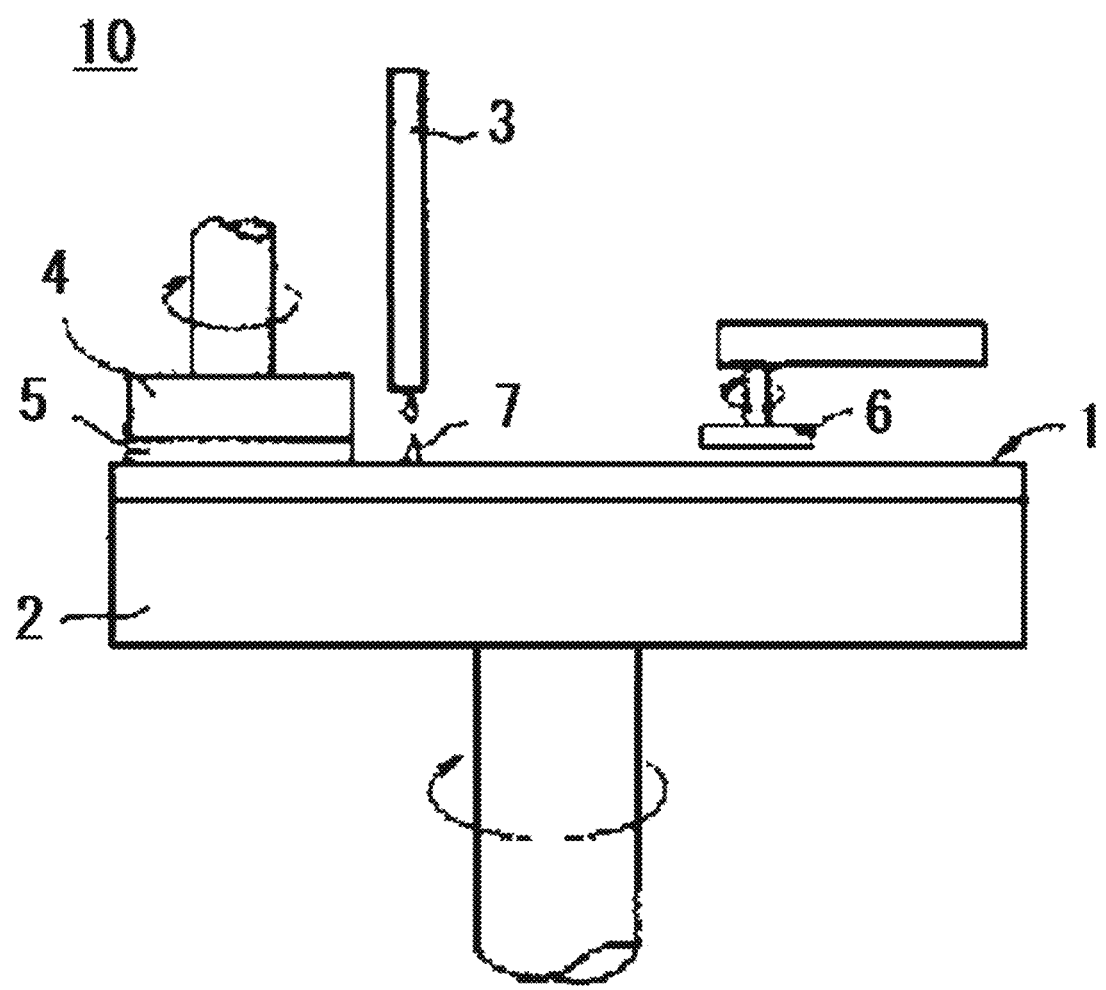
FIG. 8 is an explanatory diagram illustrating a polishing method.
Figure 9:
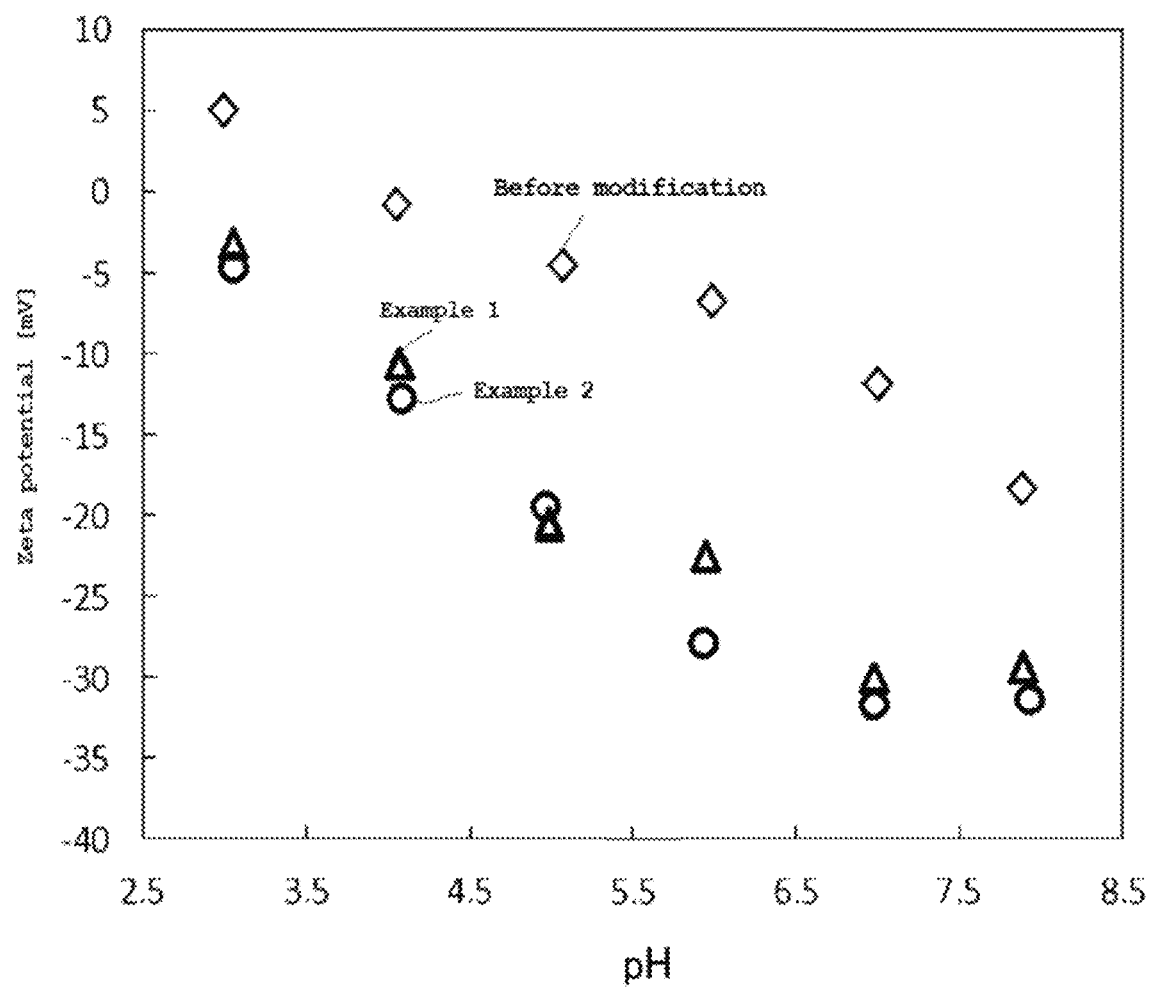
FIG. 9 is a graph showing the pH dependence of the zeta potentials of polishing pads obtained in Examples 1 and 2.

In the CMP, a CMP apparatus 10 including a rotary platen 2 having a circular shape as viewed in a top view, a slurry supply nozzle 3, a carrier 4, and a pad conditioner 6 as shown in FIG. 8 is used, for example. A polishing pad 1 including the above-described polishing layer is attached to the surface of the rotary platen 2 using double-sided tape or the like. In addition, the carrier 4 supports an object 5 to be polished.

In the CMP apparatus 10, the rotary platen 2 is rotated by a motor (not shown) in the direction indicated by the arrow. The carrier 4 is rotated, in the plane of the rotary platen 2, by a motor (not shown), for example, in the direction indicated by the arrow. The pad conditioner 6 is also rotated, in the plane of the rotary platen 2, by a motor (not shown), for example, in the direction indicated by the arrow.

First, while pouring distilled water onto the polishing surface of the polishing pad 1 that is fixed to the rotary platen 2 and is rotated, the CMP pad conditioner 6 in which diamond particles are fixed onto the surface of a carrier by electrodeposition of nickel or the like is pressed against the polishing surface so as to condition the polishing surface of the polishing pad 1. Through conditioning, the polishing surface is adjusted to have a surface roughness suitable for polishing the surface to be polished. Next, a slurry 7 is supplied from the slurry supply nozzle 3 to the polishing surface of the rotating polishing pad 1. In performing CMP, a lubricating oil, a coolant, and the like may be optionally used in combination with the slurry.

Here, as the slurry, it is preferable to use an acidic slurry for use in CMP that contains, for example, a liquid medium such as water or oil; abrasive grains such as silica, alumina, cerium oxide, zirconium oxide or silicon carbide; a base, an acid, a surfactant, an oxidizing agent such as a hydrogen peroxide solution, a reducing agent, and a chelating agent. Note that an acidic slurry, an alkaline slurry, and a near neutral slurry are available as the slurry; however, in the case of using the polishing layer of the first example described above, it is particularly preferable to use an acidic slurry having a pH of 2.0 to 7.0, in particular, a pH of 3.0 to 6.0, because the high affinity for the slurry can be maintained when performing CMP. When an oxidizing agent is contained in the slurry, even if the polishing layer has an aldehyde group or a hydroxyl group in the surface thereof before polishing, these groups are oxidized into a carboxyl group by the oxidizing agent contained in the slurry, so that the zeta potential of the polishing surface can be made negative during polishing.

Then, the object 5 to be polished that is fixed to the carrier 4 and is rotated is pressed against the polishing pad 1 on which the slurry 7 is evenly spread on the polishing surface of the polishing layer. Then, the polishing treatment is continued until a predetermined flatness is achieved. Adjustment of the pressing force applied during polishing or the speed of relative movement between the rotary platen 2 and the carrier 4 affects the finishing quality.

The polishing conditions are not particularly limited; however, the rotational speed of each of the rotary platen and the carrier is preferably as low as 300 rpm or less in order to efficiently perform polishing, and the pressure applied to the object to be polished is preferably 150 kPa or less in order to prevent a flaw from being caused after polishing. During polishing, it is preferable that the slurry is continuously supplied to the polishing surface using a pump or the like. The amount of the slurry supplied is not particularly limited, but the polishing slurry is preferably supplied such that the polishing surface is constantly covered with the slurry.

Then, after the object to be polished that has undergone polishing is fully washed with running water, it is preferable to dry the object to be polished by removing water droplets attached thereto by using a spin drier or the like. In this manner, a smooth surface can be achieved over the entire surface to be polished as a result of polishing the surface to be polished with the slurry.

Such CMP according to the present embodiment can be preferably used for polishing performed during the production process of various semiconductor devices, MEMS (MicroElectro Mechanical Systems), and the like. The CMP can be preferably used to polish objects to be polished, including, for example, an insulating film such as an oxide film formed on a semiconductor substrate, a wiring metal film of copper, aluminum, tungsten or the like; and a barrier metal film of tantalum, titanium, tantalum nitride, titanium nitride or the like, in particular, an insulating film such as an oxide film. The CPM can also be used to polish a metal film on which a pattern such as a wiring pattern or a dummy pattern is formed. The pitch between lines in the pattern may differ depending on the product, but is usually about 50 nm to 100 μm.

EXAMPLES

The production method and the modification method of a polyurethane, the polyurethane, and the modification method of a polishing pad according to the present invention will be described in further detail by way of examples. It should be noted that the scope of the present invention is not to be construed as being limited to the following examples.

Example 1 cis-2-butene-1,4-diol (CBD) serving as a chain extender having an ethylenically unsaturated bond, 1,5-pentanediol (PD) serving as a chain extender having no ethylenically unsaturated bond, polytetramethylene glycol having a number-average molecular weight of 850 (PTG850), and 4,4'-diphenylmethane diisocyanate (MDI) were mixed at the mixing proportions (mass %) shown in Table 1, which were set such that the proportion of the chain extender (CBD) having an ethylenically unsaturated bond in the total amount of CBD and the chain extender having no ethylenically unsaturated bond was 20 mol %, and the mixture was continuously supplied, using a metering pump, into a coaxially rotating twin-screw extruder so as perform continuous melt-polymerization, to give a thermoplastic polyurethane. Then, a strand of the thermoplastic polyurethane in the molten state that had been extruded from the twin-screw extruder was cooled by being continuously extruded into water, and subsequently finely cut into pellets using a pelletizer. Then, the obtained pellets were dried through dehumidification for 20 hours at 80° C., thus producing a thermoplastic polyurethane (PU1) having an ethylenically unsaturated bond.

Then, using a hot pressing machine, the pellets of PU1 were sandwiched between Teflon sheets, and press-molded at 200 to 230° C., to give a molded sheet of PU1 having a thickness of 0.3 to 0.5 mm. Then, the molded sheet of PU1 was immersed in a 0.25 mass % aqueous solution of sorbic acid (SPA) at 50° C. as an aqueous solution of a compound (B1) having a conjugated double bond, then allowed to stand for 24 hours, and subsequently taken out, followed by washing and drying. In this manner, a molded sheet of PU1 that had been subjected to modification treatment was obtained The surface properties of PU1 before and after modification treatment were evaluated in the following manner.
(Zeta Potential)

The surface of the molded sheet of PU1 that had been cut out into 30 mm×60 mm was washed. Then, using an electrophoretic light scattering device (ELS-Z, manufactured by Otsuka Electronics Co., Ltd.), the sample was attached to a plate measurement cell, and measurement was carried out using a monitor latex (manufactured by Otsuka Electronics Co., Ltd.) dispersed in 10 mM aqueous NaCl solutions that had been adjusted to a pH of 3.0 and a pH of 5.0, respectively, with an aqueous HCl solution. Similarly, measurement was also carried out using a monitor latex dispersed in a 10 mM aqueous NaCl solution that had been adjusted to a pH of 8.0 with an aqueous NaOH solution. FIG.

9 shows a graph representing the pH dependence of the zeta potential of each of the polishing pads obtained in Example 1 and Example 2, which will be described later.

(Contact Angle with Water)

Molded sheets of PU1 having a thickness of 0.3 mm before and after modification treatment were prepared. Each of the molded sheets was allowed to stand for 3 days under the conditions: 20° C. and 65% RH, and subsequently the contact angle with water was measured using a DropMaster 500 manufactured by Kyowa Interface Science Co., Ltd.

The results of the above-described measurement are shown in Table 1 below.

Example 4

PU1 was subjected to modification treatment and evaluated in the same manner as in Example 1 except that a 0.25 mass % aqueous solution of divinylenimine (DBI) at 50° C. was used as the aqueous solution of the compound (B1) having a conjugated double bond. The results are shown in Table 1.

Example 5 cis-2-butene-1,4-diol (CBD) serving as a chain extender having an ethylenically unsaturated bond, polytetramethyl-

TABLE 1

| Example No. | 1 | 2 | 3 | 4 | 5 | 6 | 7 | 8 | 9 | 10 | Com. Ex. 1 | Com. Ex. 2 |
|---|---|---|---|---|---|---|---|---|---|---|---|---|
| Mixing proportion (mass %) | | | | | | | | | | | | |
| CBD | 3.70 | 3.70 | 3.70 | 3.70 | 18.0 | 18.0 | — | — | — | — | — | — |
| CNO | — | — | — | — | — | — | 4.9 | 4.9 | — | — | — | — |
| PD | 17.3 | 17.3 | 17.3 | 17.3 | — | — | 14.4 | 14.4 | 19.1 | 19.1 | 21.7 | 21.7 |
| PTG850 | 20.9 | 20.9 | 20.9 | 20.9 | 23.9 | 23.9 | 28.8 | 28.8 | 21.1 | 21.1 | 20.1 | 20.1 |
| PTG600 | — | — | — | — | — | — | — | — | — | — | — | — |
| Butadiene polyol | — | — | — | — | — | — | — | — | 6.2 | 6.2 | — | — |
| MDI | 58.1 | 58.1 | 58.1 | 58.1 | 58.1 | 58.1 | 51.8 | 51.8 | 53.6 | 53.6 | 58.1 | 58.1 |
| Mol % of compound having ethylenically unsaturated bond contained in chain extender or polyol | 20 | 20 | 20 | 20 | 100 | 100 | 20 | 20 | 20 | 20 | 0 | 0 |
| (B1) | SBA | FDCA | FFA | DBI | SBA | FDCA | SBA | FDCA | SBA | FDCA | SBA | FDCA |
| Zeta potential (before modification) | | | | | | | | | | | | |
| pH. 3.0 | 5.2 | 5.2 | 5.2 | 5.2 | 2.7 | 2.7 | 4.2 | 4.2 | −0.3 | −0.3 | 0.6 | 0.6 |
| pH. 5.0 | −4.4 | −4.4 | −4.4 | −4.4 | −4.4 | −4.4 | −10.4 | −10.4 | −0.9 | −0.9 | −7.9 | −7.9 |
| pH. 8.0 | −18.5 | −18.5 | −18.5 | −18.5 | −14.6 | −14.6 | −18.4 | −18.4 | −8.8 | −8.8 | −13.6 | −13.6 |
| Zeta potential (after modification) | | | | | | | | | | | | |
| pH. 3.0 | −3.3 | −5.0 | −3.0 | 7.5 | −2.4 | −4.0 | −6.4 | −8.9 | −0.5 | −0.4 | 1.1 | 0.7 |
| pH. 5.0 | −21.2 | −19.3 | −10.9 | −1.0 | −12.5 | −12.0 | −16.6 | −17.1 | −4.1 | −5.4 | −6.6 | −6.4 |
| pH. 8.0 | −29.7 | −31.5 | −22.9 | −12.0 | −20.7 | −22.1 | −27.2 | −28.9 | −27.5 | −30.6 | −12.9 | −12.5 |
| Contact angle before modification (degree) | 72 | 72 | 72 | 72 | 74 | 74 | 79 | 79 | 80 | 80 | 70 | 70 |
| Contact angle after modification (degree) | 69 | 67 | 67 | 68 | 67 | 67 | 74 | 75 | 76 | 77 | 70 | 70 |

Example 2

PU1 was subjected to modification treatment and evaluated in the same manner as in Example 1 except that a 0.25 mass % aqueous solution of 2,5-furandicarboxylic acid (FDCA) at 50° C. was used as the aqueous solution of the compound (B1) having a conjugated double bond. The results are shown in Table 1.

Example 3

PU1 was subjected to modification treatment and evaluated in the same manner as in Example 1 except that a 0.25 mass % aqueous solution of furfuryl alcohol (FFA) at 50° C. was used as the aqueous solution of the compound (B1) having a conjugated double bond. The results are shown in Table 1.

ene glycol having a number-average molecular weight of 850 (PTG850), and 4,4'-diphenylmethane diisocyanate (MDI) were mixed at the mixing proportions (mass %) shown in Table 1, which were set such that the proportion of the chain extender (CBD) having an ethylenically unsaturated bond in the total amount of CBD and the chain extender having no ethylenically unsaturated bond was 100 mol %, and the mixture was continuously supplied, using a metering pump, into a coaxially rotating twin-screw extruder so as perform continuous melt-polymerization, to give a thermoplastic polyurethane. Then, a strand of the thermoplastic polyurethane in the molten state that had been extruded from the twin-screw extruder was cooled by being continuously extruded into water, and subsequently finely cut into pellets using a pelletizer. Then, the obtained pellets were dried through dehumidification for 20 hours at 80° C., thus producing a thermoplastic polyurethane (PU2) having an ethylenically unsaturated bond.

PU2 was subjected to modification treatment and evaluated in the same manner as in Example 1 except that PU2 was used in place of PU1 in Example 1. The results are shown in Table 1.

Example 6

PU2 was subjected to modification treatment and evaluated in the same manner as in Example 5 except that a 0.25 mass % aqueous solution of FDCA at 50° C. was used as the aqueous solution of the compound (B1) having a conjugated double bond. The results are shown in Table 1.

Example 7 cis-3-nonene-1-ol (CNO) serving as a chain extender having an ethylenically unsaturated bond, 1,5-pentanediol (PD) serving as a chain extender having no ethylenically unsaturated bond, polytetramethylene glycol having a number-average molecular weight of 850 (PTG850), and 4,4'-diphenylmethane diisocyanate (MDI) were mixed at the mixing proportions shown in Table 1, which were set such that the proportion of the chain extender (CNO) having an ethylenically unsaturated bond in the total amount of CNO and the chain extender having no ethylenically unsaturated bond was 20 mol %, and the mixture was continuously supplied, using a metering pump, into a coaxially rotating twin-screw extruder so as perform continuous melt-polymerization, to give a thermoplastic polyurethane. Then, a strand of the thermoplastic polyurethane in the molten state that had been extruded from the twin-screw extruder was cooled by being continuously extruded into water, and subsequently finely cut into pellets using a pelletizer. Then, the obtained pellets were dried through dehumidification for 20 hours at 80° C., thus producing a thermoplastic polyurethane (PU3) having an ethylenically unsaturated bond.

PU3 was subjected to modification treatment and evaluated in the same manner as in Example 1 except that PU3 was used in place of PU1 in Example 1. The results are shown in Table 1.

Example 8

PU3 was subjected to modification treatment and evaluated in the same manner as in Example 7 except that a 0.25 mass % aqueous solution of FDCA at 50° C. was used as the aqueous solution of the compound (B1) having a conjugated double bond. The results are shown in Table 1.

Example 9

1,5-pentanediol (PD), a polybutadiene diol having a number-average molecular weight of 1000 and serving as a polymer polyol having an ethylenically unsaturated bond, polytetramethylene glycol having a number-average molecular weight of 850 (PTG850), and 4,4'-diphenylmethane diisocyanate (MDI) were mixed at the mixing proportions shown in Table 1, which were set such that the proportion of the polymer diol having an ethylenically unsaturated bond in the total amount of the polymer diol and PTG850 was 20 mol %, and the mixture was continuously supplied, using a metering pump, into a coaxially rotating twin-screw extruder so as perform continuous melt-polymerization, to give a thermoplastic polyurethane. Then, a strand of the thermoplastic polyurethane in the molten state that had been extruded from the twin-screw extruder was cooled by being continuously extruded into water, and subsequently finely cut into pellets using a pelletizer. Then, the obtained pellets were dried through dehumidification for 20 hours at 80° C., thus producing a thermoplastic polyurethane (PU4) having an ethylenically unsaturated bond. PU4 was subjected to modification treatment and evaluated in the same manner as in Example 1 except that PU4 was used in place of PU1 in Example 1. The results are shown in Table 1.

Example 10

PU4 was subjected to modification treatment and evaluated in the same manner as in Example 9 except that a 0.25 mass % aqueous solution of FDCA at 50° C. was used as the aqueous solution of the compound (B1) having a conjugated double bond. The results are shown in Table 1.

Comparative Example 1

1,5-pentanediol (PD), polytetramethylene glycol having a number-average molecular weight of 850 (PTG850), and 4,4'-diphenylmethane diisocyanate (MDI) were mixed at the mixing proportions shown in Table 1, and the mixture was continuously supplied, using a metering pump, into a coaxially rotating twin-screw extruder so as perform continuous melt-polymerization, to give a thermoplastic polyurethane. Then, a strand of the thermoplastic polyurethane in the molten state that had been extruded from the twin-screw extruder was cooled by being continuously extruded into water, and subsequently finely cut into pellets using a pelletizer. Then, the obtained pellets were dried through dehumidification for 20 hours at 80° C., thus producing a thermoplastic polyurethane (PU5) having no ethylenically unsaturated bond. PU5 was subjected to modification treatment and evaluated in the same manner as in Example 1 except that PU5 was used in place of PU1 in Example 1. The results are shown in Table 1.

Comparative Example 2

PU5 was subjected to modification treatment and evaluated in the same manner as in Comparative Example 1 except that a 0.25 mass % aqueous solution of FDCA at 50° C. was used as the aqueous solution of the compound (B1) having a conjugated double bond. The results are shown in Table 1.

Example 11

4-hydroxymethyl-5-methylimidazole (HMI) serving as a chain extender having a conjugated double bond, 1,5-pentanediol (PD), polytetramethylene glycol having a number-average molecular weight of 850 (PTG850), and 4,4'-diphenylmethane diisocyanate (MDI) were mixed at the mixing proportions shown in Table 2, which were set such that the proportion of HMI in the total amount of PD and HMI was 20 mol %, and the mixture was continuously supplied, using a metering pump, into a coaxially rotating twin-screw extruder so as perform continuous melt-polymerization, to give a thermoplastic polyurethane. Then, a strand of the thermoplastic polyurethane in the molten state that had been extruded from the twin-screw extruder was cooled by being continuously extruded into water, and subsequently finely cut into pellets using a pelletizer. Then, the obtained pellets were dried through dehumidification for 20 hours at 80° C., thus producing a thermoplastic polyurethane (PU11) having a conjugated double bond Then, a molded sheet of PU11 having a thickness of 0.3 to 0.5 mm was obtained using a hot pressing machine in the same manner as in Example 1. Then, the molded sheet of PU11 was immersed in a 0.25 mass % aqueous solution of maleic acid (MA) at 50° C. as an aqueous solution of a compound (B2) having an ethylenically unsaturated bond, then allowed to stand for 24 hours, and subsequently taken out, followed by washing and drying. In this manner, a molded sheet of PU11 that had been subjected to modification treatment was obtained. The surface properties of PU11 before and after modification treatment were evaluated in the same manner as in Example 1. The results are shown in Table 2 below.

TABLE 2

| Example No. | 11 | 12 | Com. Ex. 3 |
|---|---|---|---|
| Mixing proportion (mass %) | | | |
| HMI | 4.7 | 4.7 | — |
| PD | 17.4 | 17.4 | 21.7 |
| PTG850 | 19.7 | 19.7 | 20.1 |
| MDI | 58.1 | 58.1 | 58.1 |
| Mol % of compound having conjugated double bond contained in chain extender or polyol | 20 | 20 | 0 |
| (B2) | MA | 3AIP | MA |
| Zeta potential (before modification) | | | |
| pH. 3.0 | 15.7 | 15.7 | 0.6 |
| pH. 5.0 | 2.6 | 2.6 | -7.9 |
| pH. 8.0 | -12.5 | -12.5 | -13.6 |
| Zeta potential (after modification) | | | |
| pH. 3.0 | 1.5 | 6.8 | 1.0 |
| pH. 5.0 | -3.8 | 0.6 | -7.0 |
| pH. 8.0 | -18.0 | -8.9 | -12.5 |
| Contact angle before modification (degree) | 73 | 73 | 70 |
| Contact angle after modification (degree) | 62 | 65 | 70 |

Example 12

PU11 was subjected to modification treatment and evaluated in the same manner as in Example 11 except that a 0.25 mass % aqueous solution of 3-amino-1-propene (3A1P) at 50° C. was used as the aqueous solution of the compound (B2) having an ethylenically unsaturated bond. The results are shown in Table 2.

Comparative Example 3

1,5-pentanediol (PD), polytetramethylene glycol having a number-average molecular weight of 850 (PTG850), and 4,4'-diphenylmethane diisocyanate (MDI) were mixed at the mixing proportions shown in Table 1, and the mixture was continuously supplied, using a metering pump, into a coaxially rotating twin-screw extruder so as perform continuous melt-polymerization, to give a thermoplastic polyurethane. Then, a strand of the thermoplastic polyurethane in the molten state that had been extruded from the twin-screw extruder was cooled by being continuously extruded into water, and subsequently finely cut into pellets using a pelletizer. Then, the obtained pellets were dried through dehumidification for 20 hours at 80° C., thus producing a thermoplastic polyurethane (PU12) having no conjugated double bond. PU12 was subjected to modification treatment and evaluated in the same manner as in Example 1 except that PU12 was used in place of PU11 in Example 11. The results are shown in Table 2.

Example 13 cis-2-butene-1,4-diol (CBD), 1,5-pentanediol (PD), polytetramethylene glycol having a number-average molecular weight of 850 (PTG850), and 4,4'-diphenylmethane diisocyanate (MDI) were mixed at the mixing proportions (mass %) shown in Table 3, and the mixture was subjected to solution polymerization in a 20 mss DMF solution, to give a thermoplastic polyurethane. Then, 2,5-furandicarboxylic acid (FDCA) was added to the solution in an amount of 0.25 mass %, to perform modification. Subsequently, the resulting solution was dried through dehumidification for 20 hours at 80° C., thus producing a thermoplastic polyurethane (PU21) having carboxyl group. PU21 was evaluated in the same manner as in Example 1 except that PU21 was used in place of PU1, and that the subsequent modification treatment was omitted. The results are shown in Table 3.

Comparative Example 4

1,5-pentanediol (PD), polytetramethylene glycol having a number-average molecular weight of 850 (PTG850), and 4,4'-diphenylmethane diisocyanate (MDI) were mixed at the mixing proportions (mass %) shown in Table 3, and the mixture was subjected to solution polymerization in a 20 wt % DMF solution, to give a thermoplastic polyurethane. Then, 2,5-furandicarboxylic acid (FDCA) was added to the solution in an amount of 0.25 mass %. Subsequently, the resulting solution was dried through dehumidification for 20 hours at 80° C., thus producing a thermoplastic polyurethane (PU22). PU22 was evaluated in the same manner as in Example 1 except that PU22 was used in place of PU1, and that the subsequent modification treatment was omitted. The results are shown in Table 3.

TABLE 3

| Example No. | 13 | Com. Ex. 4 |
|---|---|---|
| Mixing proportion (mass %) | | |
| CBD | 3.70 | — |
| PD | 17.3 | 21.7 |
| PTG850 | 20.9 | 20.1 |
| MDI | 58.1 | 58.1 |
| Mol % of compound having ethylenically unsaturated bond contained in chain extender or polyol | 20 | 0 |
| (B2) | FDCA | FDCA |
| Zeta potential (before modification) | | |
| pH. 3.0 | 4.9 | 0.6 |
| pH. 5.0 | -3 | -7.9 |
| pH. 8.0 | -18 | -13.6 |
| Zeta potential (after modification) | | |
| pH. 3.0 | -3.8 | 0.8 |
| pH. 5.0 | -14 | -8 |
| pH. 8.0 | -29 | -12.7 |
| Contact angle before modification (degree) | 74 | 70 |
| Contact angle after modification (degree) | 67 | 70 |

REFERENCE SIGNS LIST

1 . . . Polishing pad
2 . . . Rotary platen
3 . . . Slurry supply nozzle
4 . . . Carrier
5 . . . Object to be polished
6 . . . Pad conditioner
10 . . . CMP apparatus

The invention claimed is:

1. A method for modifying a polishing pad, the method comprising:
   preparing a polishing pad comprising in at least a polishing surface thereof, a polyurethane having an ethylenically unsaturated bond; and
   treating the polyurethane with a liquid comprising a compound having a conjugated double bond and a functional group selected from the group consisting of a carboxyl group, a metal salt of a carboxyl group, a hydroxyl group, an amino group, a sulfonic acid group, a phosphoric acid group and an imidazole group to obtain a Diels Alder ring substituted with the functional group on the polyurethane.

2. The method of claim 1,
   wherein the polyurethane comprises a polymer constituent unit derived from a compound having an ethylenically unsaturated bond.

3. The method of claim 2,
   wherein the compound having an ethylenically unsaturated bond comprises at least one compound selected from the group consisting of cis-2-butene-1,4-diol, 4,5-bis(hydroxymethyl)imidazole, 5-norbornene-2,3-dimethanol, cis-2-nonene-1-ol, cis-3-nonene-1-ol, cis-3-octene-1-ol, and polybutadiene diol.

4. A modified polishing pad obtained according to the method of claim 1.

5. The polishing pad
   of claim 4,
   wherein the polishing surface has a zeta potential at a pH of 3.0 of −1.0 mV or less.

6. The method of claim 1, wherein the polyurethane is a thermoplastic polyurethane.

7. The method of claim 6, wherein the polishing pad comprises a molded body of the thermoplastic polyurethane.

8. The method of claim 1, wherein the polishing pad has at least one groove for sufficiently supplying a slurry to the polishing surface, wherein a depth of the groove is from 0.2 to 1.8 mm and a width of the groove is from 0.1 to 3.0 mm.

9. The method of claim 1, wherein the polishing surface of the modified polishing pad has a contact angle with water of 80 degrees or less.

10. A method for modifying a polishing pad, the method comprising:
    preparing a polishing pad comprising, in at least a surface thereof, a polyurethane having a conjugated double bond; and
    treating the polishing surface with a liquid comprising a compound having an ethylenically unsaturated bond and a functional group selected from the group consisting of a carboxyl group, a hydroxyl group, an amino group, a sulfonic acid group, a phosphoric acid group and an imidazole group to obtain a Diels Alder ring substituted with the functional group on the polyurethane.

11. The method of claim 10,
    wherein the polyurethane comprises a polymer constituent unit derived from a compound having a conjugated double bond.

12. The method of claim 11,
    wherein the compound having a conjugated double bond comprises at least one compound selected from the group consisting of 4,5-bis(hydroxymethyl)imidazole, 4-hydroxymethyl-5-methylimidazole, and polyethylene furanoate.

13. A modified polishing pad obtained according to the method of claim 10.

14. The polishing pad
    of claim 13,
    wherein the polishing surface has a zeta potential at a pH of 3.0 of −1.0 mV or less.

15. The method of claim 10, wherein the polyurethane is a thermoplastic polyurethane.

16. The method of claim 15, wherein the polishing pad comprises a molded body of the thermoplastic polyurethane.

17. The method of claim 10, wherein the polishing pad has at least one groove for sufficiently supplying a slurry to the polishing surface, wherein a depth of the groove is from 0.2 to 1.8 mm and a width of the groove is from 0.1 to 3.0 mm.

18. The method of claim 10, wherein the polishing surface of the modified polishing pad has a contact angle with water of 80 degrees or less.

* * * * *